(12) United States Patent
Tai et al.

(10) Patent No.: US 12,057,450 B2
(45) Date of Patent: Aug. 6, 2024

(54) EPITAXY REGIONS WITH LARGE LANDING AREAS FOR CONTACT PLUGS

(71) Applicant: Taiwan Semiconductor Manufacturing Co., Ltd., Hsinchu (TW)

(72) Inventors: Jung-Chi Tai, Taipei (TW); Yi-Fang Pai, Hsinchu (TW); Tsz-Mei Kwok, Hsinchu (TW); Tsung-Hsi Yang, Zhubei (TW); Jeng-Wei Yu, New Taipei (TW); Cheng-Hsiung Yen, Zhubei (TW); Jui-Hsuan Chen, Hsinchu (TW); Chii-Horng Li, Zhubei (TW); Yee-Chia Yeo, Hsinchu (TW); Heng-Wen Ting, Pingtung (TW); Ming-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/818,627

(22) Filed: Aug. 9, 2022

(65) Prior Publication Data
US 2022/0384437 A1 Dec. 1, 2022

Related U.S. Application Data

(62) Division of application No. 17/143,681, filed on Jan. 7, 2021, now Pat. No. 11,652,105.
(Continued)

(51) Int. Cl.
*H01L 29/94* (2006.01)
*H01L 21/8234* (2006.01)
(Continued)

(52) U.S. Cl.
CPC .. *H01L 27/0924* (2013.01); *H01L 21/823418* (2013.01); *H01L 21/823431* (2013.01);
(Continued)

(58) Field of Classification Search
CPC ......... H01L 27/0924; H01L 21/823418; H01L 21/823431; H01L 29/0653;
(Continued)

(56) References Cited

U.S. PATENT DOCUMENTS

| | | |
|---|---|---|
| 10,868,186 B2 | 12/2020 | Chiang et al. |
| 11,043,570 B2 | 6/2021 | Yeo et al. |

(Continued)

FOREIGN PATENT DOCUMENTS

| | | |
|---|---|---|
| KR | 20160051512 A | 5/2016 |
| KR | 20180060906 A | 6/2018 |
| KR | 20200066161 A | 6/2020 |

*Primary Examiner* — Theresa T Doan
(74) *Attorney, Agent, or Firm* — Slater Matsil, LLP

(57) ABSTRACT

A method includes forming a gate stack on a first portion of a semiconductor fin, removing a second portion of the semiconductor fin to form a recess, and forming a source/drain region starting from the recess. The formation of the source/drain region includes performing a first epitaxy process to grow a first semiconductor layer, wherein the first semiconductor layer has straight-and-vertical edges, and performing a second epitaxy process to grow a second semiconductor layer on the first semiconductor layer. The first semiconductor layer and the second semiconductor layer are of a same conductivity type.

20 Claims, 22 Drawing Sheets

Related U.S. Application Data

(60) Provisional application No. 63/055,052, filed on Jul. 22, 2020.

(51) Int. Cl.
*H01L 27/092* (2006.01)
*H01L 29/06* (2006.01)
*H01L 29/66* (2006.01)
*H01L 29/76* (2006.01)
*H01L 29/78* (2006.01)

(52) U.S. Cl.
CPC .... *H01L 29/0653* (2013.01); *H01L 29/66795* (2013.01); *H01L 29/7851* (2013.01)

(58) Field of Classification Search
CPC .......... H01L 29/66795; H01L 29/7851; H01L 29/7848; H01L 29/0847; H01L 29/785; H01L 21/02532; H01L 21/02573; H01L 21/02634
USPC ........................................................ 257/288
See application file for complete search history.

(56) References Cited

U.S. PATENT DOCUMENTS

| | | |
|---|---|---|
| 11,101,347 B2 | 8/2021 | Yu et al. |
| 2013/0161756 A1 | 6/2013 | Glass et al. |
| 2015/0144998 A1 | 5/2015 | Ching et al. |
| 2017/0213892 A1 | 7/2017 | Dasgupta et al. |
| 2018/0082883 A1* | 3/2018 | Lee ................ H01L 29/7851 |
| 2018/0151683 A1 | 5/2018 | Yeo et al. |
| 2018/0151737 A1 | 5/2018 | Yang et al. |
| 2018/0190810 A1 | 7/2018 | Li et al. |
| 2019/0035932 A1 | 1/2019 | Zhou |
| 2019/0164835 A1 | 5/2019 | Lu et al. |
| 2019/0181225 A1 | 6/2019 | Lee et al. |
| 2020/0176565 A1 | 6/2020 | Ting et al. |

* cited by examiner

EPITAXY REGIONS WITH LARGE LANDING AREAS FOR CONTACT PLUGS

PRIORITY CLAIM AND CROSS-REFERENCE

This application is a divisional of U.S. patent application Ser. No. 17/143,681, filed on Jan. 7, 2021, and entitled "Epitaxy Region with Large Landing Areas for Contact Plugs," which claims the benefit of the U.S. Provisional Application No. 63/055,052, filed on Jul. 22, 2020, and entitled "Novel SD EPI Design for larger Plateau with Uniformity-Control by Constrained (110) surface," which applications are hereby incorporated herein by reference.

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs.

Such scaling-down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, implanting the semiconductor fins to form well regions, forming dummy gate electrodes on the semiconductor fins, etching some portions of the semiconductor fins, and performing an epitaxy to regrow source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
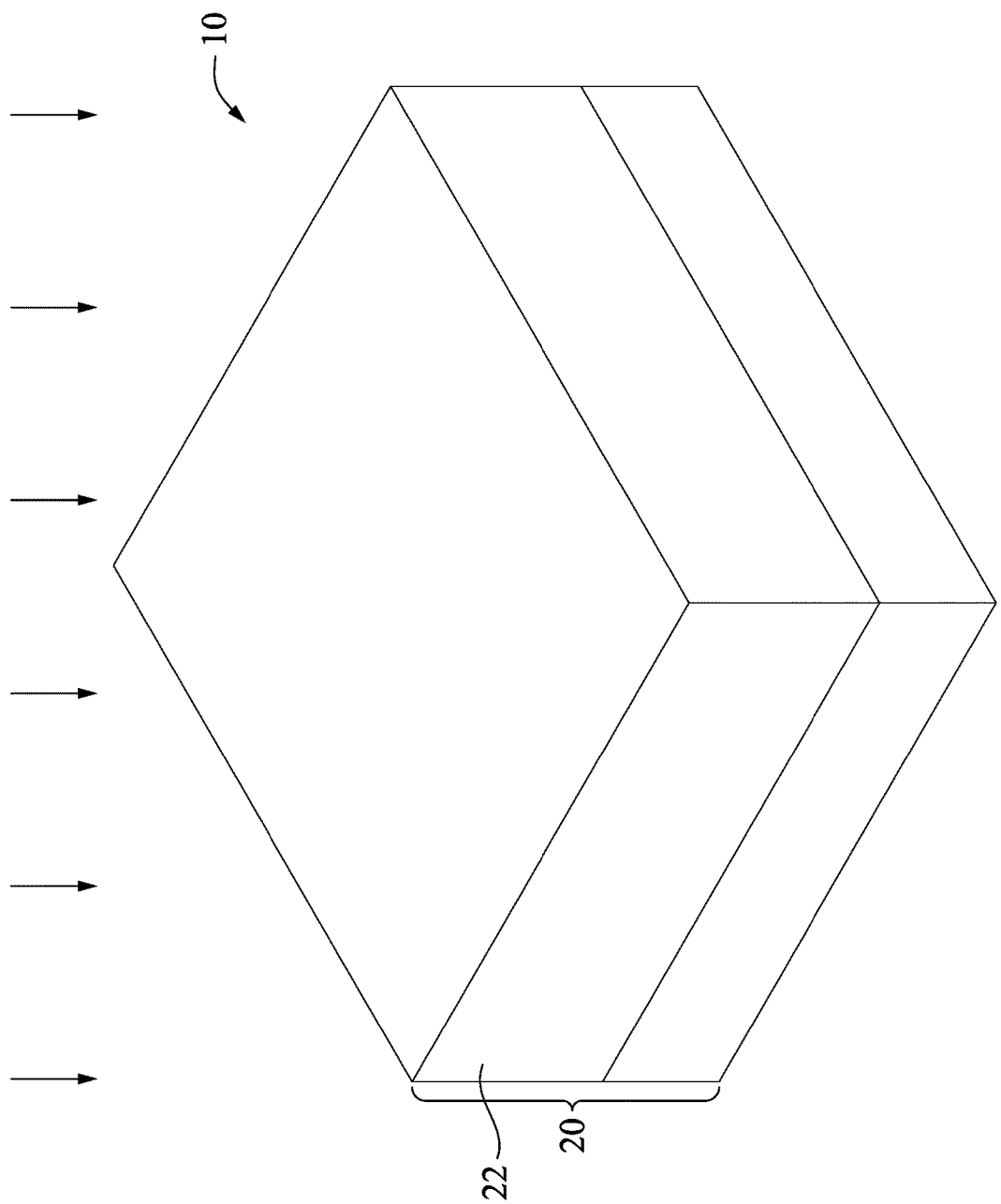
FIGS. 1-11 and 17-20 illustrate the perspective views, cross-sectional views and a top view of intermediate stages in the formation of n-type Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with some example embodiments. The intermediate stages of forming the FinFETs are illustrated. The variations of the embodiments are discussed. In accordance with some embodiments, epitaxy processes are performed to form source/drain regions for FinFETs. The epitaxy processes include performing a first epitaxy process to grow semiconductor strips having straight-and-vertical edges, with the heights of the semiconductor strips being significantly greater than their widths. A second epitaxy process is performed to grow the source/drain regions both vertically and horizontally, so that the resulting source/drain regions have relatively planar top surface with large areas. As a result, the landing areas of source/drain contact plugs are increased without increasing the lateral sizes of the source/drain regions to much. The uniformity in the epitaxy process is also improved. Throughout the various views and illustrative embodiments, like reference numbers are used to designate like elements.

Figure 22:
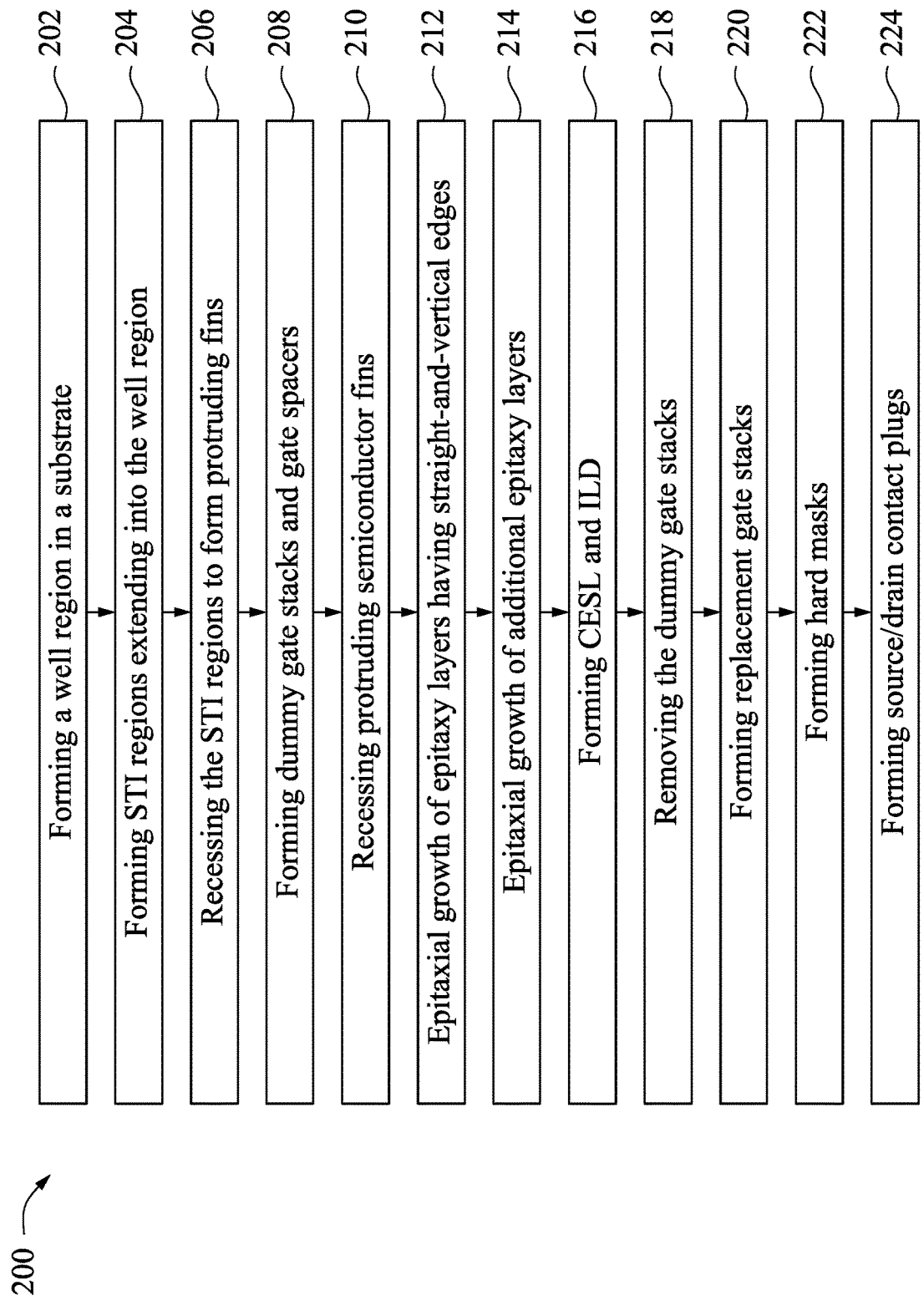
FIG. 22 illustrates a process flow for forming FinFETs in accordance with some embodiments.

FIGS. 1-11 and 17-20 illustrate perspective views, cross-sectional views and a top view of intermediate stages in the formation of n-type Fin Field-Effect Transistors (FinFETs) in accordance with some embodiments. The processes shown in FIGS. 1-11 and 17-20 are also illustrated schematically in the process flow 200 as shown in FIG. 22.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 22. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
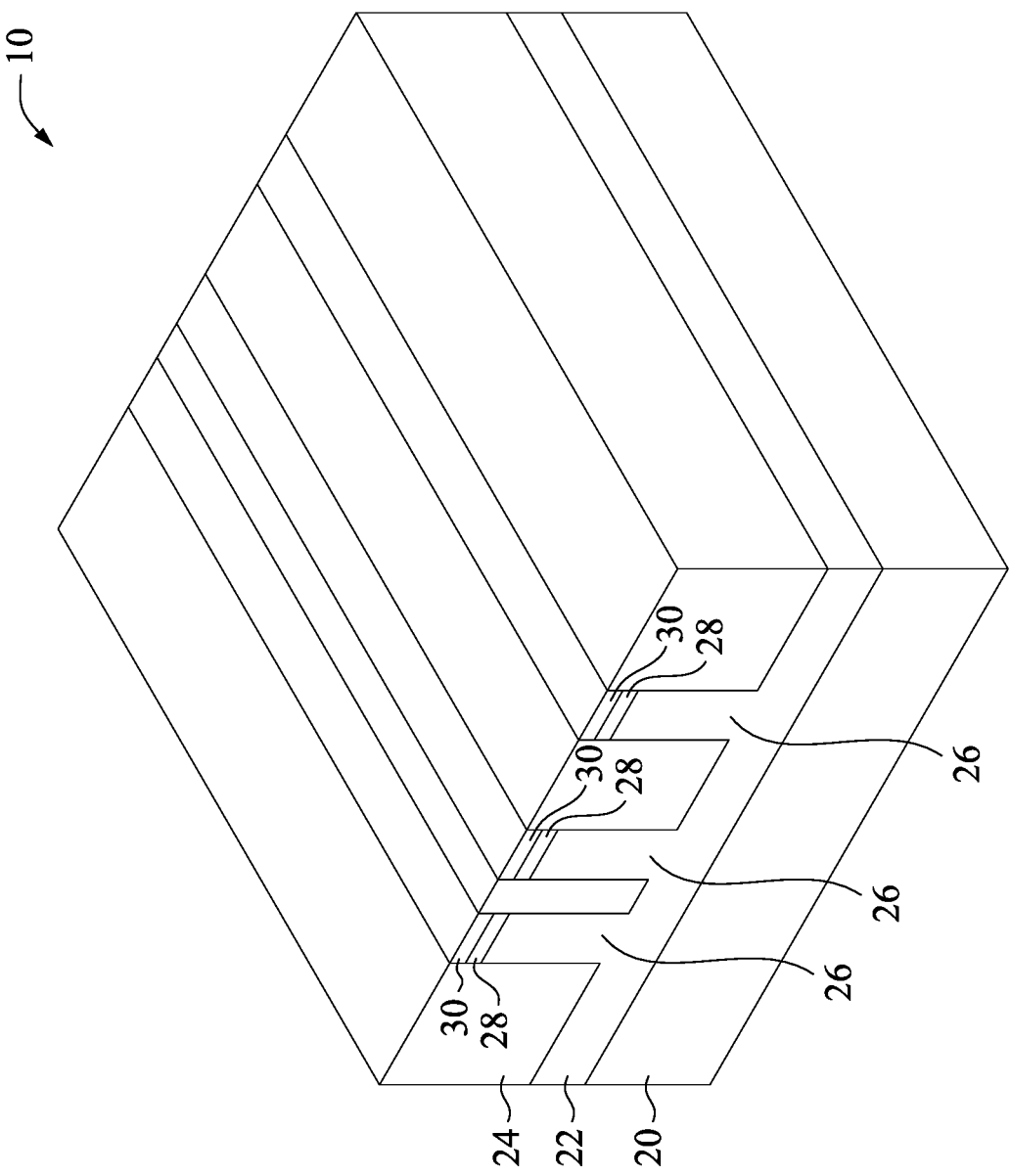

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 22. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitriding of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
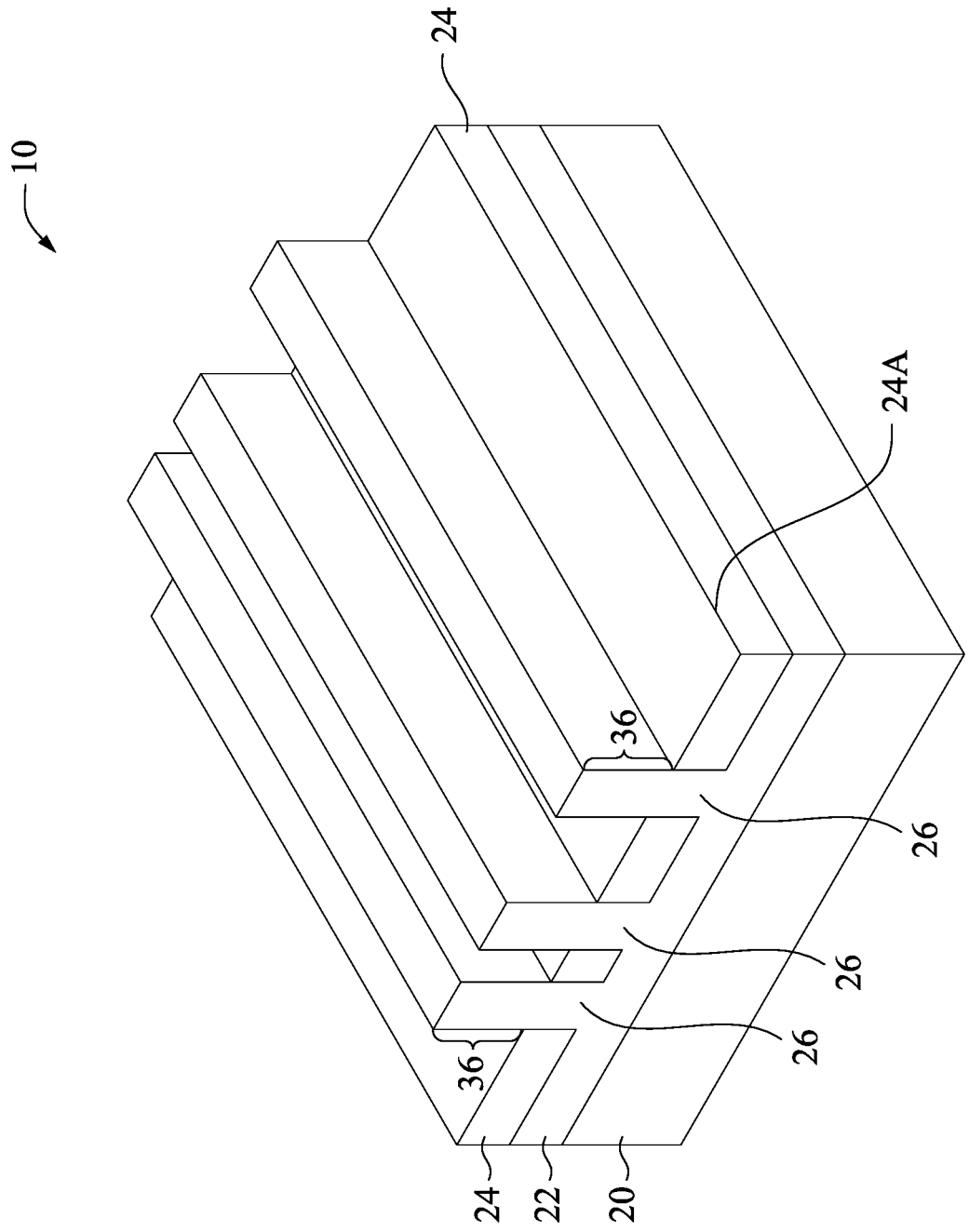

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 22. The etching may be performed using a dry etching process, wherein NF$_3$ and NH$_3$, for example, are used as the etching gases. During the etching process, plasma may be generated. Argon may also be included. In accordance with alternative embodiments of the present disclosure, the recessing of STI regions 24 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
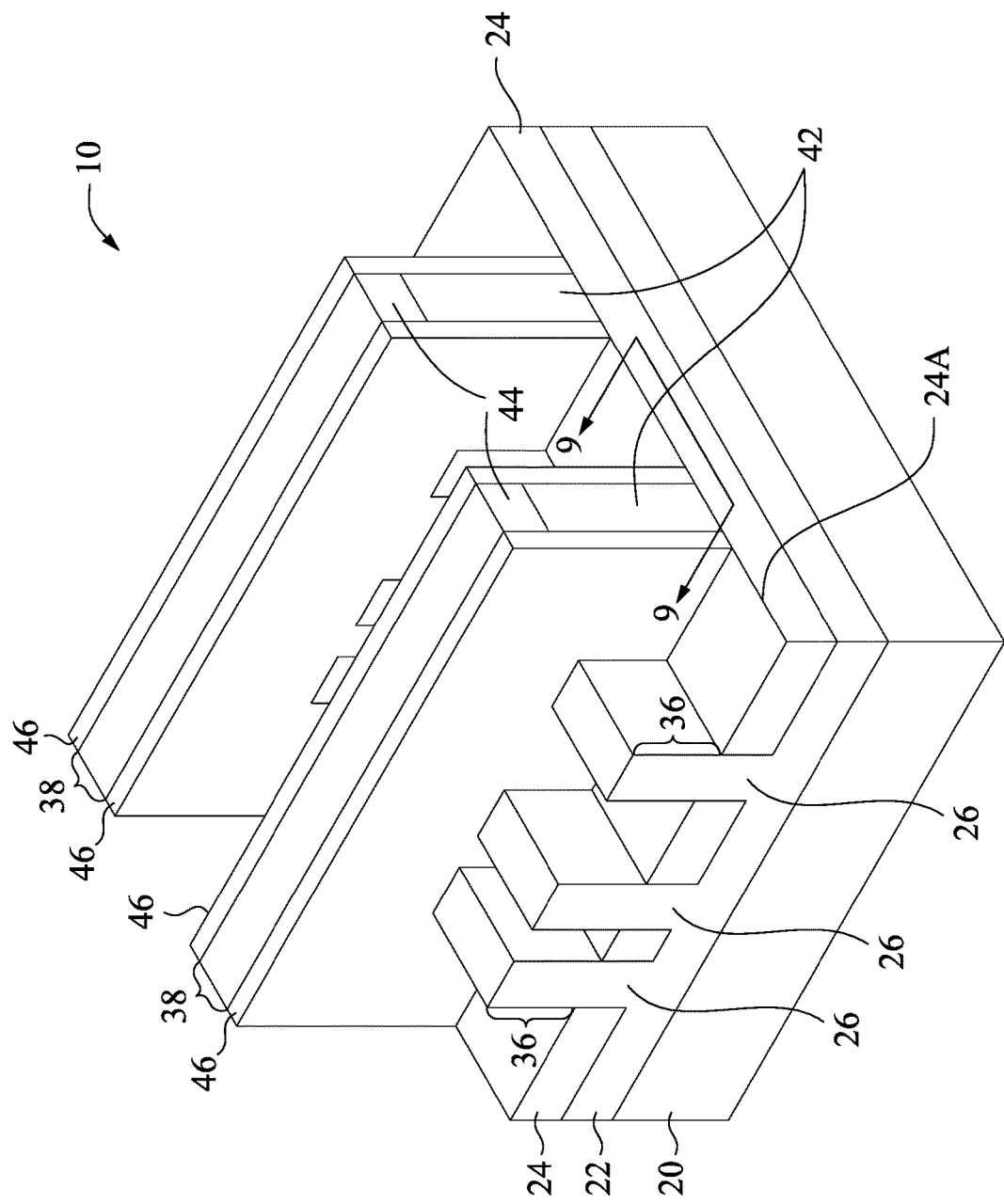

Referring to FIG. 4, dummy gate stacks 38 are formed to extend on the top surfaces and the sidewalls of (protruding) fins 36. The respective process is illustrated as process 208 in the process flow 200 shown in FIG. 22. Dummy gate stacks 38 may include dummy gate dielectrics (not shown) and dummy gate electrodes 42 over the dummy gate dielectrics. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 22. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
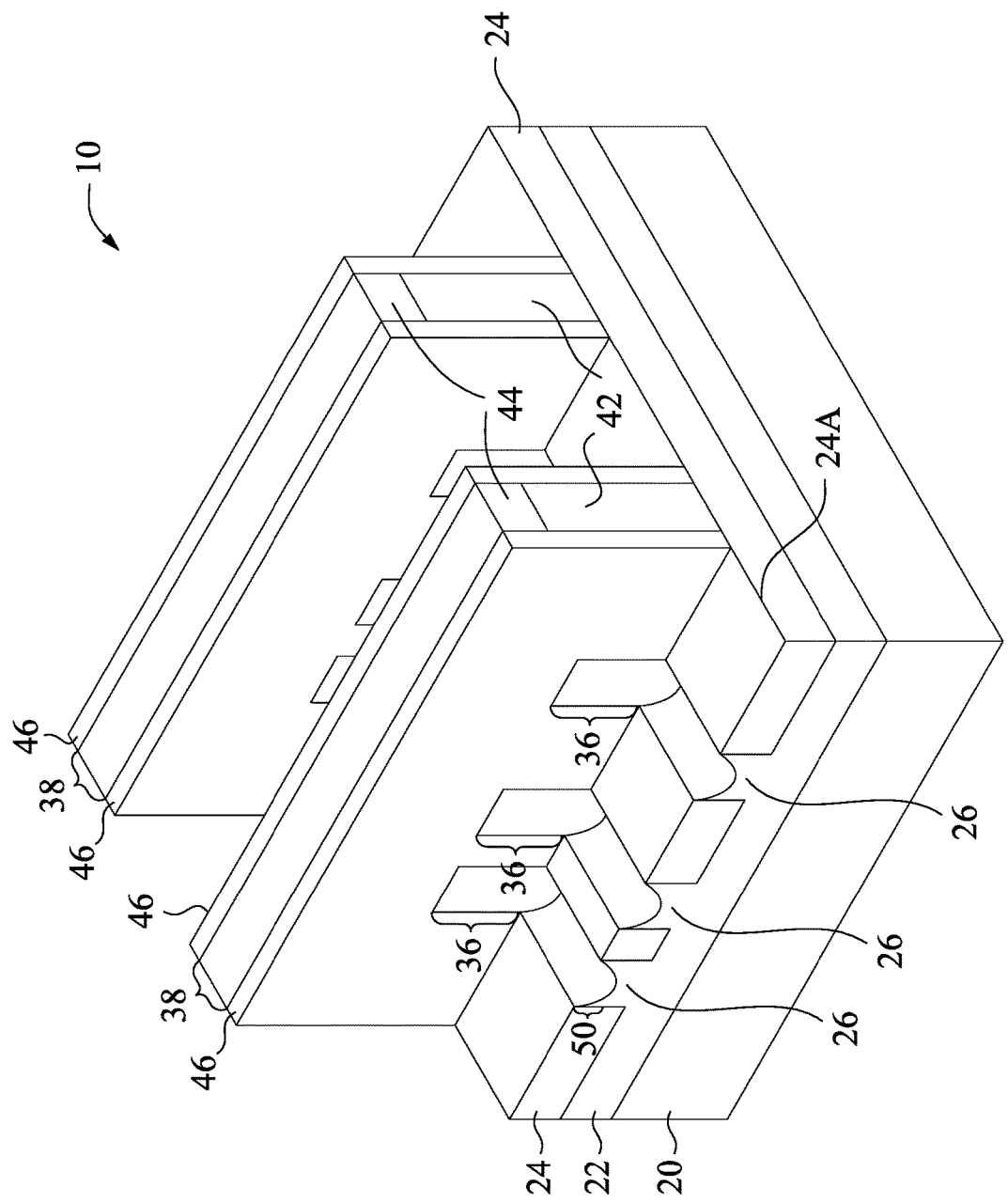

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 22. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise some portions located on the opposite sides of dummy gate stacks 38, and some portions between remaining portions of protruding fins 36.

Figure 6:
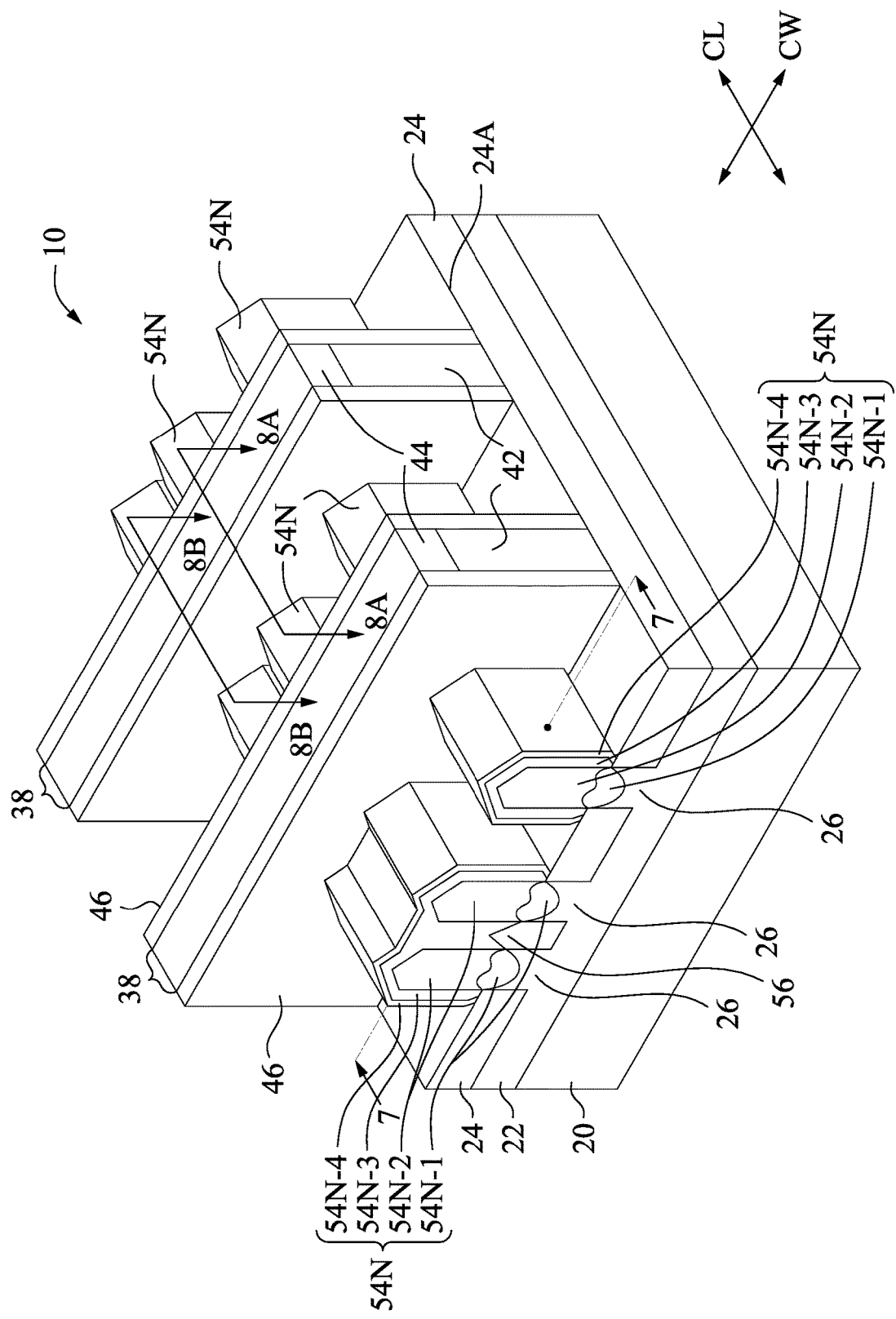

Next, as shown in FIG. 6, n-type epitaxy regions (source/drain regions) 54N are formed by selectively growing (through epitaxy) a semiconductor material(s) in and beyond recesses 50. The well region 22 in accordance with these embodiments is a p-type well region. In accordance with some embodiments, epitaxy regions 54N includes a plurality of epitaxy layers, each may be formed of or comprise SiAs, SiP, SiCP, SiC, or the like. Air gap 56 may be formed directly under a portion of source/drain region 54N that includes the merged epitaxy material growing from two neighboring recesses 50. Throughout the description, the channel width direction of FinFETs is indicated as direction CW (as shown in FIG. 6), and the channel length direction (the source-drain direction) is indicated as direction CL, which directions are also shown in subsequent figures.

In accordance with some embodiments, each of epitaxy regions 54N includes epitaxy layer 54N-1, epitaxy layer 54N-2, epitaxy layer 54N-3, and epitaxy layer 54N-4, which may be formed using different process conditions, and/or having different compositions. Throughout the description, when two layers are referred to as having the same composition, it means that the two layers have same types of elements, and the percentages of the elements in the two layers are the same as each other. Conversely, when two layers are referred to as having different compositions, one of the two layers either has at least one element not in the other layer, or the two layers have the same elements, but the atomic percentages of the elements in two layers are different from each other.

Figure 7:
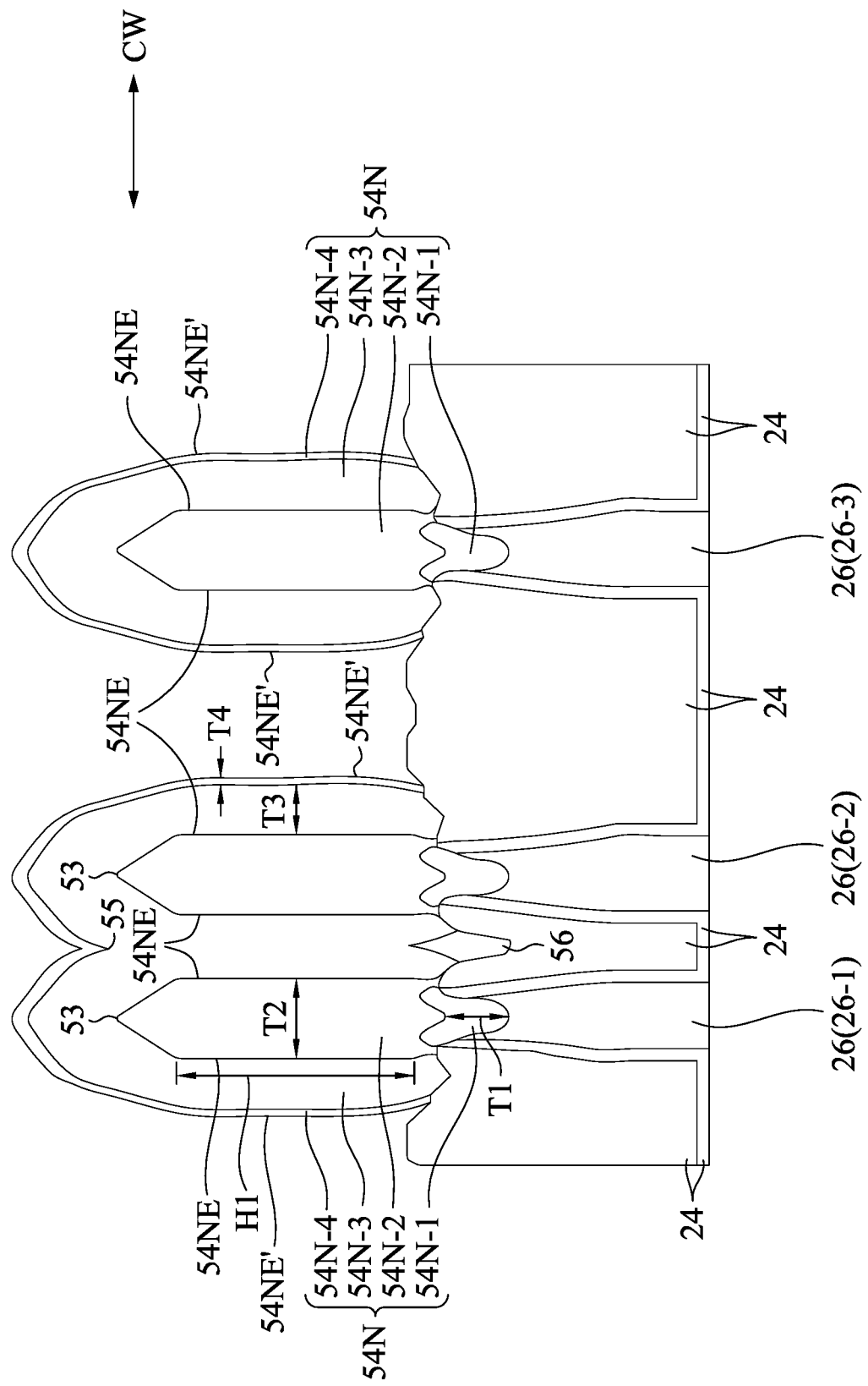
Figure 8:
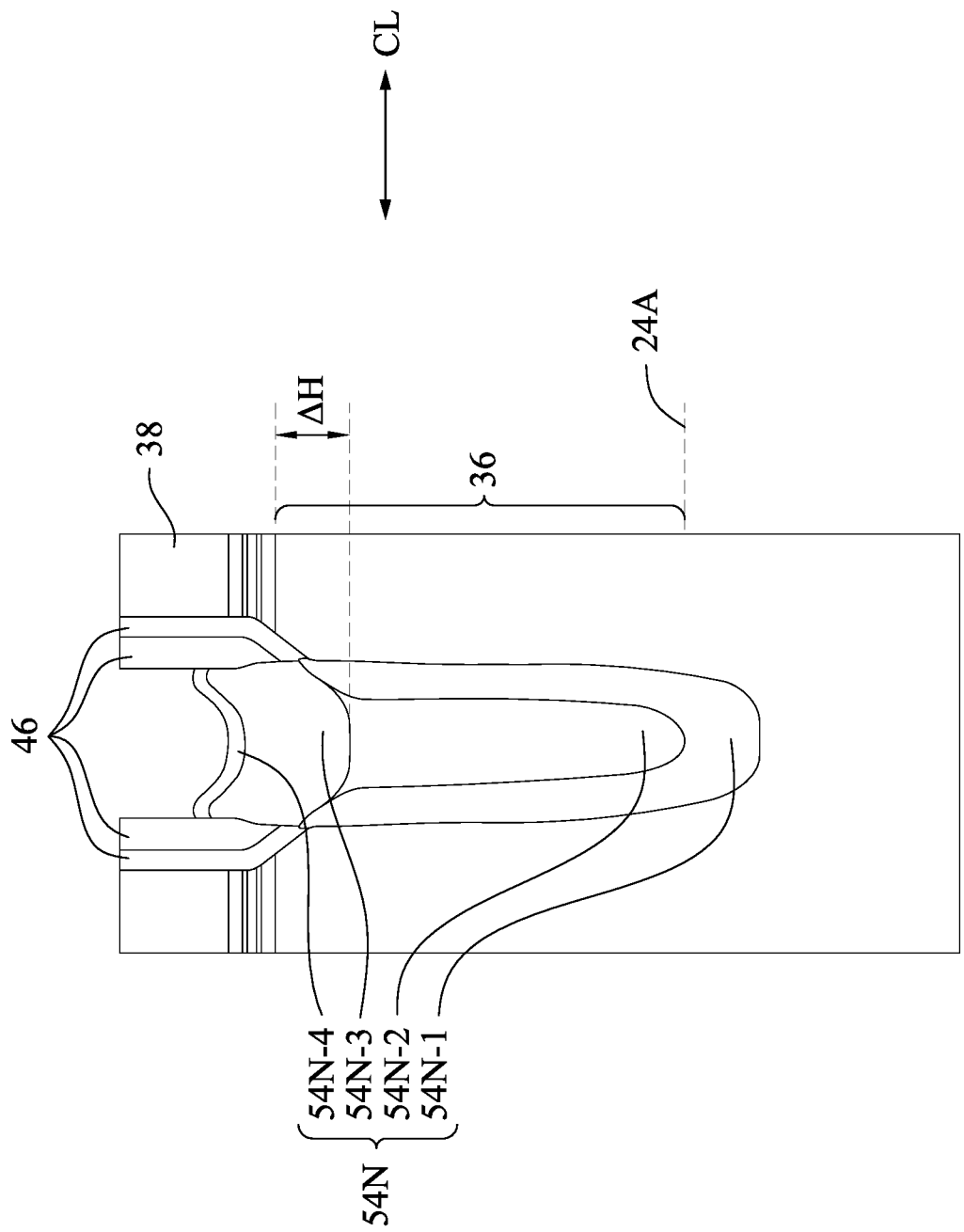

FIG. 7 illustrates a cross-sectional view of reference cross section 7-7 in FIG. 6. The illustrated example includes two source/drain regions 54N, with the source/drain region 54N on the left includes the epitaxy semiconductor material grown starting from two semiconductor strips 26-1 and 26-2. The source/drain region 54N on the right includes the epitaxy semiconductor material grown starting from a single semiconductor strip 26-3. FIG. 8 illustrates the cross-sectional view of reference cross-section 8A-8A or reference cross-section 8B-8B in FIG. 6.

In accordance with some embodiments, a first epitaxy process is performed to grow first epitaxy layers 54N-1. In accordance with alternative embodiments, the epitaxy of epitaxy layers 54N-1 is skipped, and epitaxy layers 54N-2 are formed directly on the top surfaces of semiconductor strips 26. The first epitaxy layers 54N-1 may comprise SiAs, SiP, SiCP, SiC, or the like. The precursors may include a silicon-containing gas such as silane, disilane, dichlorosilane, or the like, and may or may not include an n-type dopant-containing gas such as $PH_3$, $AsH_3$, or the like. In accordance with some embodiments, the epitaxy of first epitaxy layers 54N-1 is performed at a first temperature temp1, which may be selected, so that the resulting first epitaxy layers 54N-1 is conformal. For example, temperature temp1 may be in the range between about 600° C. and about 800° C. The thickness T1 (FIG. 7) of epitaxy layers 54N-1 may be in the range between about 5 nm and about 10 nm. Epitaxy layers 54N-1 may have an n-type dopant (such as phosphorous, if doped) concentration in the range between about $5 \times 10^{20}/cm^3$ and about $1 \times 10^{22}/cm^3$. Epitaxy layers 54N-1 may also include carbon, with the concentration of carbon being in the range between about $1 \times 10^{21}/cm^3$ and about $1 \times 10^{22}/cm^3$. It is appreciated that arsenic may also be used instead of phosphorus, and the discussion of the concentration of phosphorus in epitaxy layers 54N-1, 54N-2, 54N-3, and 54N-4 may also apply to arsenic. The deposition method of epitaxy layers 54N-1 may include Chemical Vapor Deposition (CVD), Molecular Bean Epitaxy (MBE), Physical Vapor Deposition (PVD), ALD, and the like.

Epitaxy layers 54N-2 are then epitaxially grown. The respective process is illustrated as process 212 in the process flow 200 shown in FIG. 22. In accordance with some embodiments, epitaxy layers 54N-2 may comprise SiAs, SiP, SiCP, or the like. The precursors may include a silicon-containing gas such as silane, disilane, dichlorosilane, or the like, and an n-type dopant-containing gas such as $PH_3$, $AsH_3$, or the like. In accordance with some embodiments, the epitaxy of epitaxy layers 54N-2 is performed at a second temperature temp2, which may be equal to or higher than the first temperature temp1. The resulting epitaxy layers 54N-2 may have an n-type dopant (such as phosphorous) concentration between about $1 \times 10^{21}/cm^3$ and about $1 \times 10^{22}/cm^3$. The formation method may include CVD, Molecular Bean Epitaxy (MBE), PVD, ALD, and the like, and the method may be the same as or different from the method for forming epitaxy layers 54N-1.

It is appreciated that the second temperature temp2 affects whether the edges 54NE are vertical-and-straight or not, and hence are controlled to be in a selected range such as in the range between about 600° C. and about 900° C. The vertical-and-straight edges may be on (110) surface planes of the epitaxy material. In accordance with some embodiments, once vertical-and-straight edges 54NE are formed, the prolonging of the epitaxy process results in the vertical-and-straight edges 54NE to grow upwardly, but not horizontally. Accordingly, epitaxy layers 54N-2 grow upwardly with time, while the thickness T2 remain not increased with the proceeding of the epitaxy. In accordance with other embodiments, once vertical-and-straight edges 54NE are formed, the continued epitaxy process results in the epitaxy layers 54N-2 to grow both vertically and horizontally. The vertical growth rate VGR-N, however, are significantly greater than the horizontal growth rate HGR-N, for example, with ratio VGR-N/HGR-N being greater than 5 or greater than about 10. Epitaxy layers 54N-2 may have triangular top surfaces, each being formed of two slanted-and-straight top surfaces.

In accordance with some embodiments, the thickness T2 (FIG. 7) of epitaxy layers 54N-2 may be in the range between about 30 nm and about 40 nm. The vertical-and-straight edges 54NE of epitaxy layers 54N-2 have a height H1, which may be greater than about 30 nm. Height H1 may also be in the range between about 30 nm and about 150 nm, and may be in the range between about 60 nm and about 200 nm. Ratio H1/T2 may be greater than about 2 or about 5, and may be in the range between about 5 and about 10. Furthermore, as shown in FIG. 8, the top surfaces of epitaxy layers 54N-2 may be level with, or slightly lower than the top surface of protruding fins 36, for example, with height difference ΔH (FIG. 8) being smaller than about 10 nm.

Epitaxy layers 54N-3 are then grown. The respective process is illustrated as process 214 in the process flow 200 shown in FIG. 22. In accordance with some embodiments, the epitaxy layers 54N-3 may comprise SiAs, SiP, SiCP, or the like. The composition of epitaxy layers 54N-3 may be the same as, or different from, the composition of the respective underlying epitaxy layers 54N-2. For example, the n-type dopant concentration in epitaxy layers 54N-3 may be equal to or greater than the n-type dopant concentration in epitaxy layers 54N-2. The precursors may include a silicon-containing gas such as silane, disilane, dichlorosilane, or the like, and an n-type dopant-containing gas such as $PH_3$, $AsH_3$, or the like. In accordance with some embodiments, the epitaxy of epitaxy layers 54N-3 is performed at a third temperature temp3 lower than the second temperature temp2. Temperature temp3 is further selected, so that there is also a significant lateral growth (which is different from epitaxy layers 54N-2) when epitaxy layers 54N-3 is grown vertically. In accordance with some embodiments, temperature temp3 is lower than temperature temp2 by difference (temp2−temp3), which is greater than about 25° C., and may be in the range between about 25° C. and about 100° C. For example, temperature temp3 may be in the range between about 500° C. and about 800° C. In accordance with some embodiments, the growth of epitaxy layers 54N-3 are conformal, with different portions having the same thickness T3, which may be in the range between about 30 nm and about 40 nm. Due to the conformal growth, some portions of edges 54NE' are vertical and straight, and are on the (110) surface planes of the grown semiconductor material. The resulting epitaxy layers 54N-3 may have an n-type dopant concentration in the range between about $1 \times 10^{21}/cm^3$ and about $1 \times 10^{22}/cm^3$. The formation method may include CVD, Molecular Bean Epitaxy (MBE), Physical Vapor Deposition (PVD), and the like, and the method may be the same as or different from the method for forming each of epitaxy layers 54N-1 and 54N-2.

The growth of epitaxy layers 54N-3 is performed until the portions grown from separate epitaxy layers 54N-2 are merged with each other. Furthermore, the growth may be performed until the merging point 55 is level with or higher than the top tips 53 of epitaxy layers 54N-2.

Fourth epitaxy layers 54N-4 are then epitaxially grown. In accordance with some embodiments, epitaxy layers 54N-4 may comprise SiAs, SiP, SiCP, or the like. The precursors may be selected from the same candidate groups of precursors for forming epitaxy layers 54N-1, 54N-2, and 54N-3. In accordance with some embodiments, the epitaxy of epitaxy layers 54-4 is performed at a temperature temp4, which may be in the range between about 600° C. and about 800° C. The temperature temp4 may be equal to or higher than temperature temp3. The temperature temp4 is further selected, so that either epitaxy layers 54N-4 are conformal, or the growth rate of top portions on top of epitaxy layers 54N-3 are higher than the growth rate of sidewall portions on the sidewalls of epitaxy layers 54N-3. Epitaxy layers 54N-4 may have a phosphorous concentration between about $1 \times 10^{20}/cm^3$ and about $1 \times 10^{22}/cm^3$. The n-type dopant concentration of epitaxy layers 54N-4 may also be equal to or lower than the n-type dopant concentration of epitaxy layers 54N-3. The formation method may include CVD, Molecular Bean Epitaxy (MBE), Physical Vapor Deposition (PVD), and the like, and the method may be the same as or different from the method for forming epitaxy layers 54N-3. The thickness T4 of epitaxy layers 54N-4 may be in the range between about 2 nm and about 10 nm.

In accordance with some embodiments, the temperatures and the resulting n-type dopant in epitaxy layers 54N-1, 54N-2, 54-N3, and 54N-4 may be any value as aforementioned. In accordance with some embodiments, the transition from the growth of epitaxy layers 54N-2 to the growth of epitaxy layers 54N-3 is achieved by reducing temperature, without changing all other process conditions including, and not limited to, the types of precursors, the flow rates, the partial pressures, etc. The transition from the growth of epitaxy layers 54N-1 to the growth of epitaxy layers 54N-2 may, or may not be accompanied by the introducing or the increase of the flow rate of the n-type dopant-containing precursor, and the increase in the temperature. The transition from the growth of epitaxy layers 54N-3 to the growth of epitaxy layers 54N-4 may, or may not be accompanied by the introduction or the increase of the flow rate of the n-type dopant-containing precursor, and/or the increase in the temperature.

After the epitaxy step, epitaxy regions 54N may be further implanted with a p-type or an n-type impurity to form source and drain regions, which are also denoted using reference numeral 54N. In accordance with alternative embodiments of the present disclosure, the implantation step is skipped when epitaxy regions 54N are in-situ doped with the p-type or n-type impurity during the epitaxy.

Figure 9:
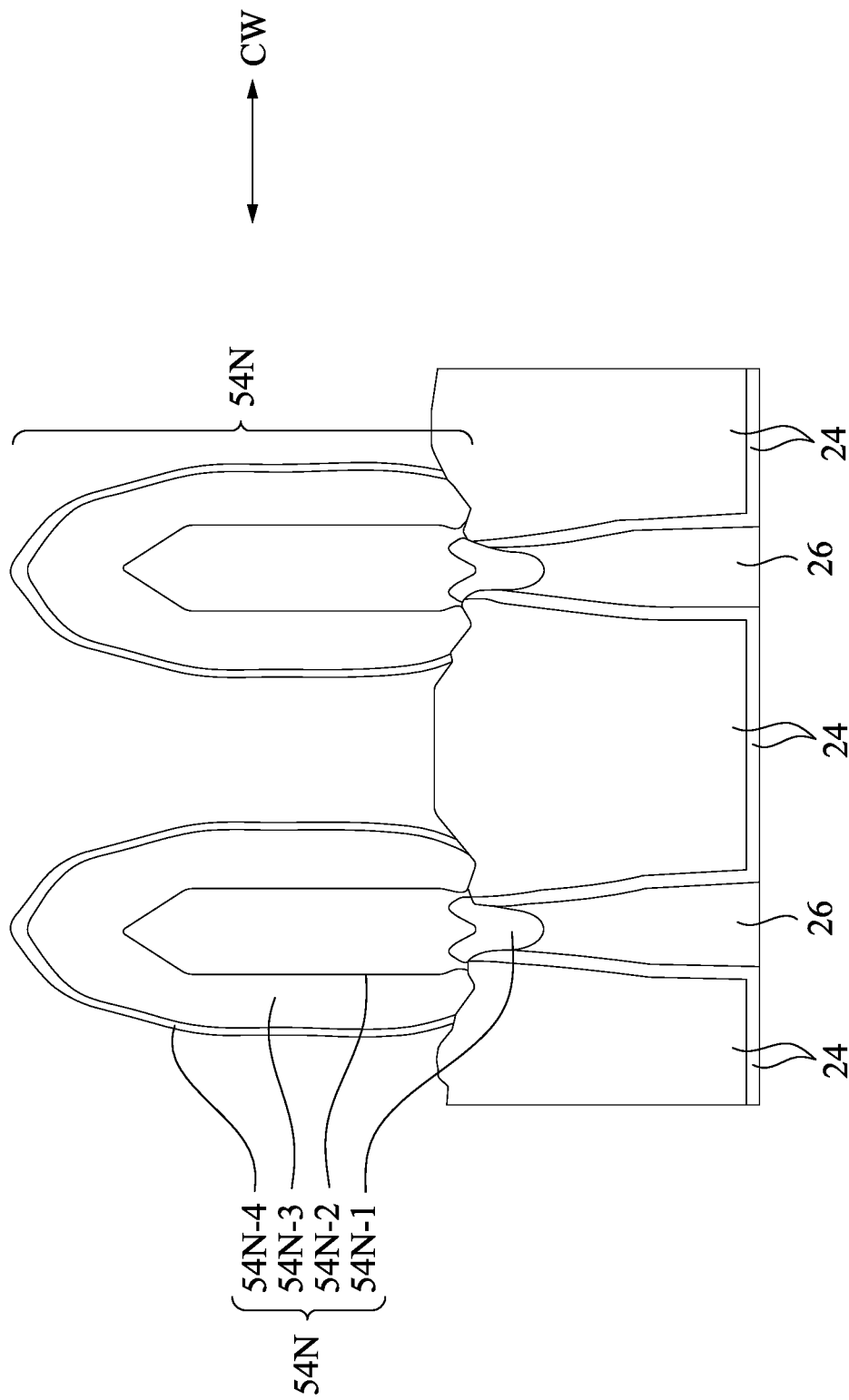
Figure 10:
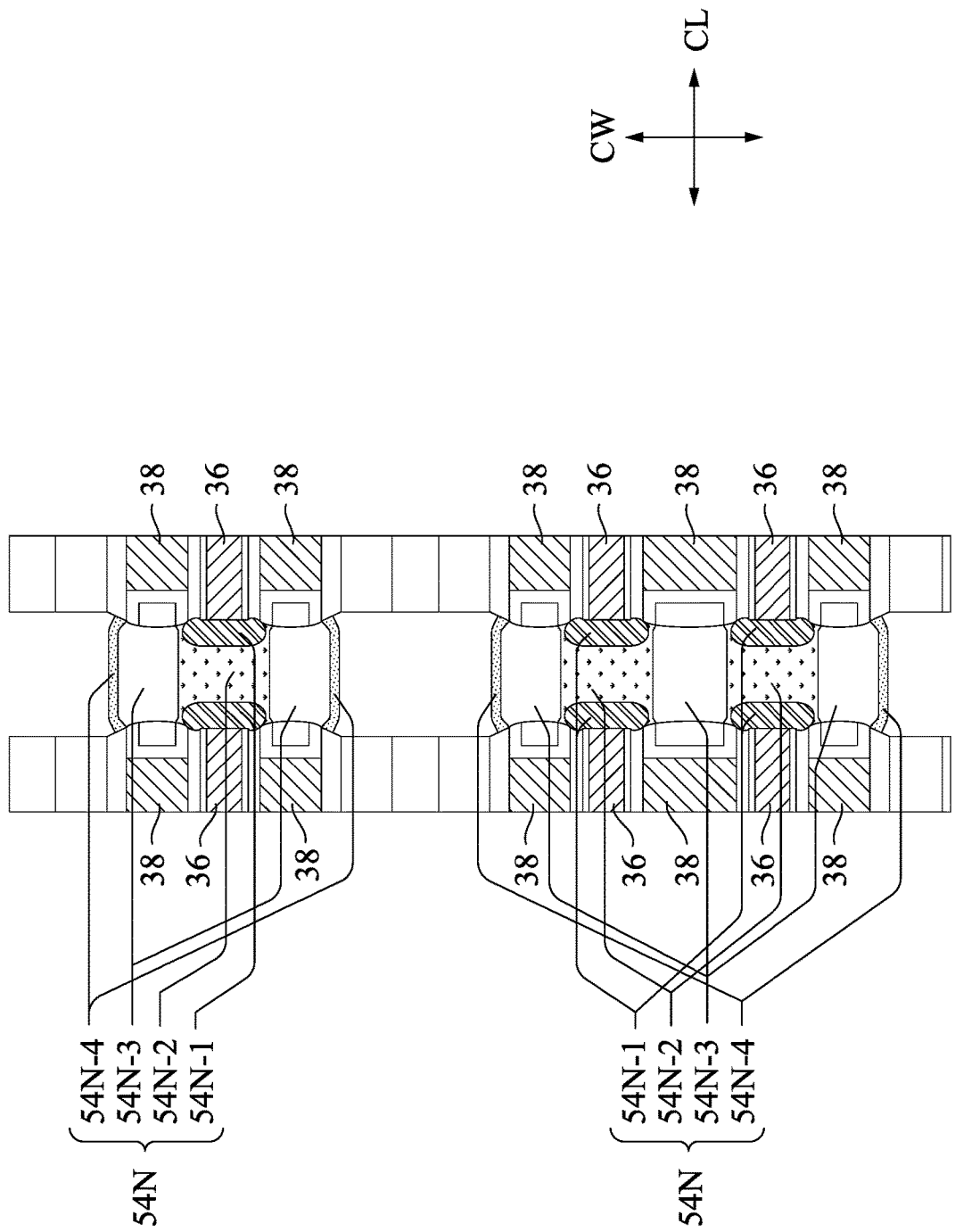
Figure 11:
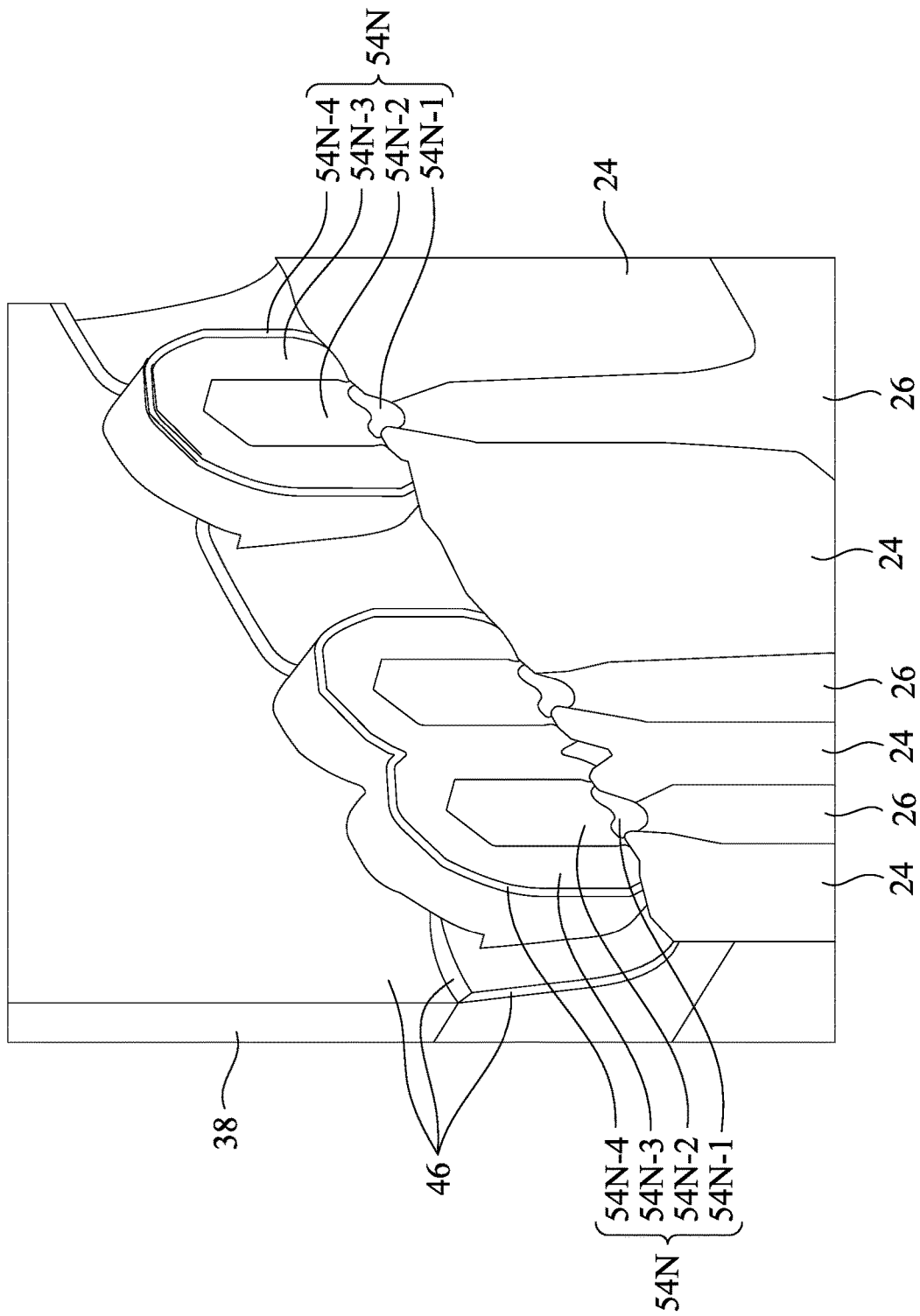

FIG. 9 illustrates a cross-sectional view in which two epitaxy regions 54N are grown, and are separated from each other after the epitaxy processes are finished. FIG. 10 illustrates a top view of epitaxy regions 54N. The top view is obtained at a level (for example, level 9-9 in FIG. 4) between the top surface and the bottom surface of protruding fins 36, so that both of dummy gate stacks 38 and protruding fins 36 are in the illustrated plane. The positions of each of epitaxy layers 54N-1, 54N-2, 54N-3, and 54N-4 are illustrated. Epitaxy layers 54N-1 are grown from the sidewalls of protruding fins 36, and epitaxy layers 54N-2 are grown between opposing portions of epitaxy layers 54N-1. Epitaxy layers 54N-3 and 54N-4 also include portions on opposing sides of epitaxy layers 54N-2. FIG. 11 illustrates a perspective view of dummy gate stack 38, gate spacers 46, STI regions 22, and epitaxy regions 54N in accordance with some embodiments.

Figure 17:
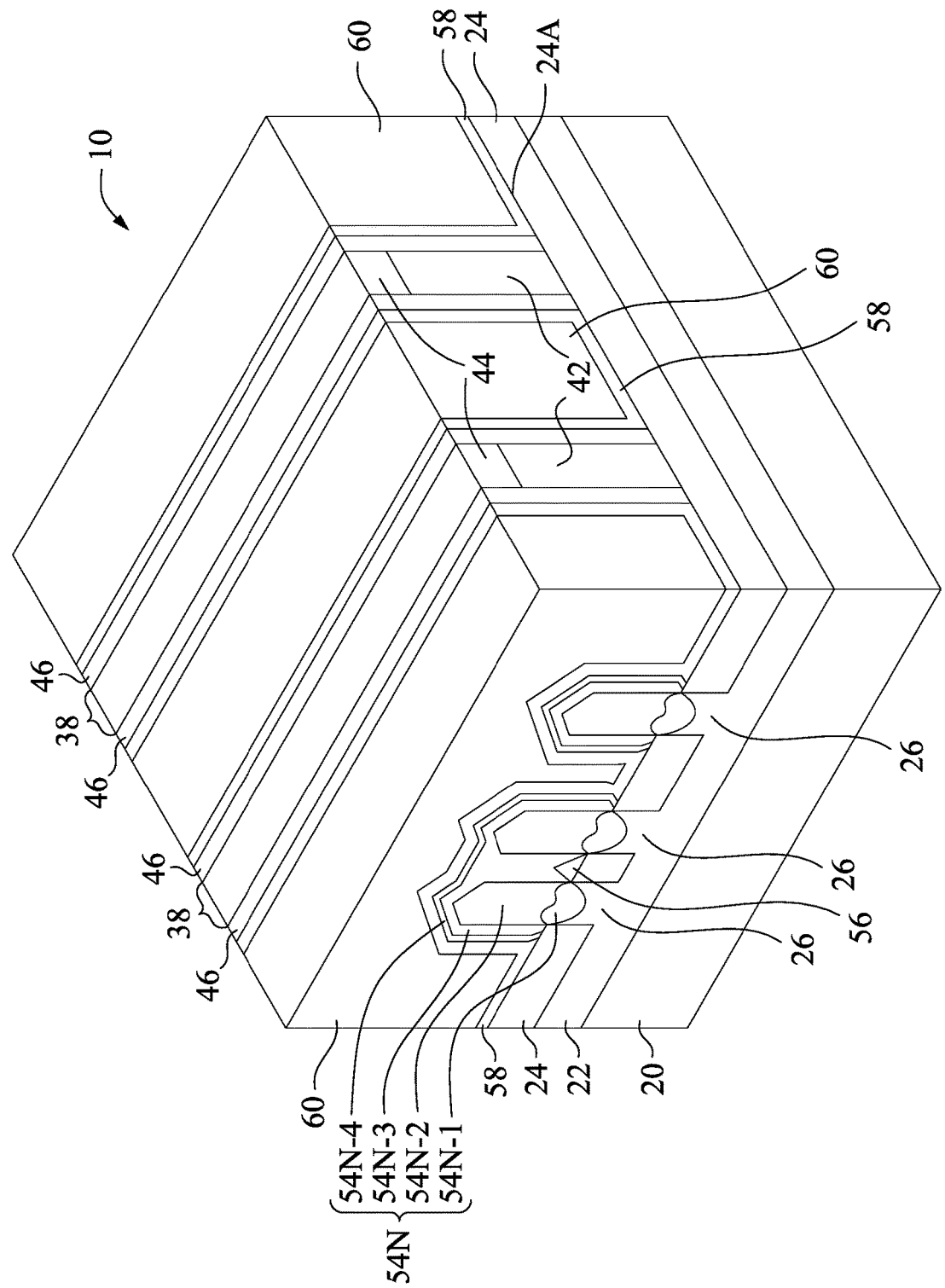

FIG. 17 illustrates a perspective view of the structure after the formation of Contact Etch Stop Layer (CESL) 58 and Inter-Layer Dielectric (ILD) 60. The respective process is illustrated as process 216 in the process flow 200 shown in FIG. 22. CESL 58 may be formed of or comprise silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), a low-k dielectric material, or the like. A planarization process such as a CMP process or a mechanical grinding process may be performed to level the top surfaces of ILD 60, dummy gate stacks 38, and gate spacers 46 with each other.

Figure 18:
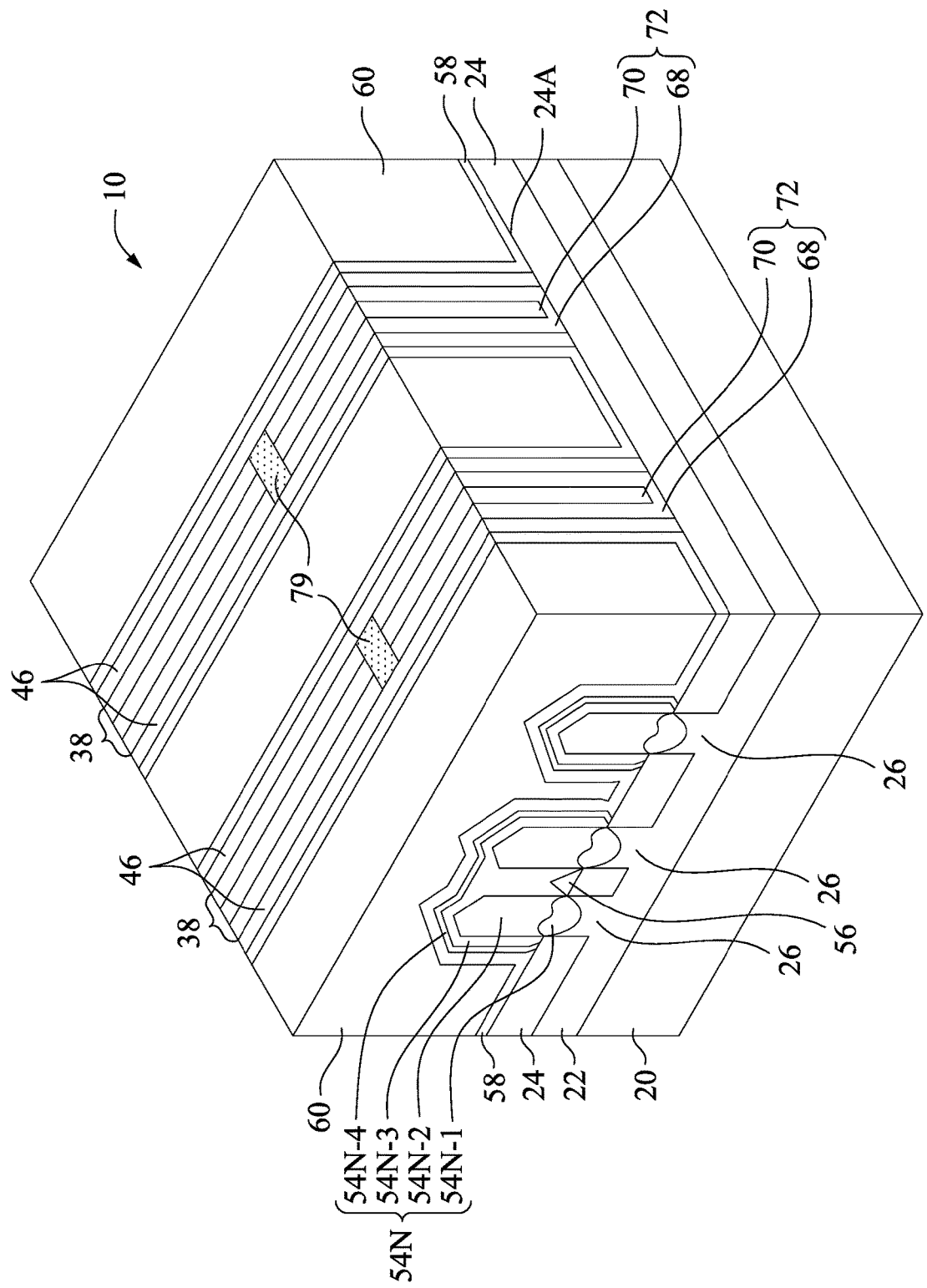

Next, the dummy gate stacks 38 including hard mask layers 44, dummy gate electrodes 42 and the dummy gate dielectrics are etched, forming trenches between gate spacers 46. The respective process is illustrated as process 218 in the process flow 200 shown in FIG. 22. The top surfaces and the sidewalls of protruding fins 36 are exposed to the trenches. Next, as shown in FIG. 18, replacement gate stacks 72 are formed in the trenches. The respective process is illustrated as process 220 in the process flow 200 shown in FIG. 22. Replacement gate stacks 72 include gate dielectrics 68 and the corresponding gate electrodes 70.

In accordance with some embodiments of the present disclosure, gate dielectric 68 includes an Interfacial Layer (IL) as its lower part. The IL is formed on the exposed top surfaces and sidewall surfaces of protruding fins 36. The IL may include an oxide layer such as a silicon oxide layer, which is formed through the thermal oxidation or chemical oxidation of the surface layers of protruding fins 36, or through a deposition process. Gate dielectric 68 may also include a high-k dielectric layer formed over the IL. The high-k dielectric layer includes a high-k dielectric material such as hafnium oxide, lanthanum oxide, aluminum oxide, zirconium oxide, or the like, or composite layers thereof. The dielectric constant (k-value) of the high-k dielectric material is higher than 3.9, and may be higher than about 7.0. The high-k dielectric layer is formed as a conformal layer, and extends on the top surfaces and sidewalls of protruding fins 36 and the top surface and the sidewalls of gate spacers 46.

Further referring to FIG. 18, gate electrode 70 is formed on gate dielectric 68. Gate electrode 70 may include a plurality of stacked layers, which may be formed as conformal layers, and filling-metal regions filling the rest of the trenches unfilled by the plurality of stacked layers. The stacked layers may include a barrier layer, one or a plurality of work function layers over the barrier layer, and possibly a glue layer over the work function layer(s). In accordance with some embodiments, the high-k dielectric layer and the stacked layers are deposited layer-by-layer as conformal layers, followed by the deposition of the filling-metal regions to fully fill the trenches. A planarization process such as a CMP process or a mechanical grinding process is performed to remove excess portions of the deposited materials, resulting in the structure shown in FIG. 18. In accordance with some embodiments, gate isolation regions 79 are formed to cut each of the long gate stacks 72 into two portions, with one portion acting as the gate stack of transistor 76N-1 (FIG. 20), and the other portion acting as the gate stack of transistor 76N-2 (FIG. 20).

Figure 19:
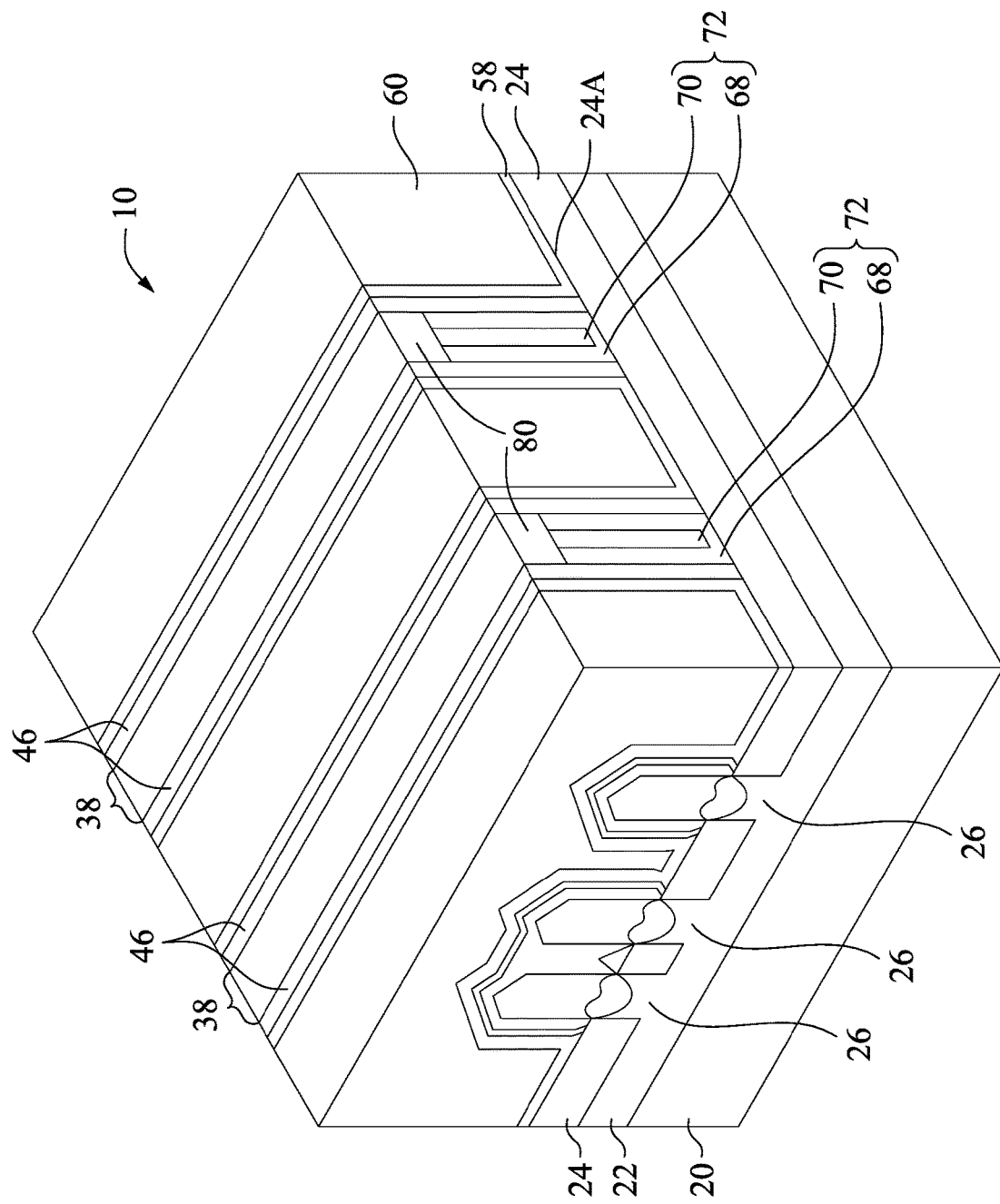

FIG. 19 illustrates the formation of hard masks 80 in accordance with some embodiments. The respective process is illustrated as process 222 in the process flow 200 shown in FIG. 22. The formation of hard masks 80 may include performing an etching process to recess gate stacks 72, so that recesses are formed between gate spacers 46, filling the recesses with a dielectric material, and then performing a planarization process such as a CMP process or a mechanical grinding process to remove excess portions of the dielectric material. Hard masks 80 may be formed of silicon nitride, silicon oxynitride, silicon oxy-carbo-nitride, or the like.

Figure 20:
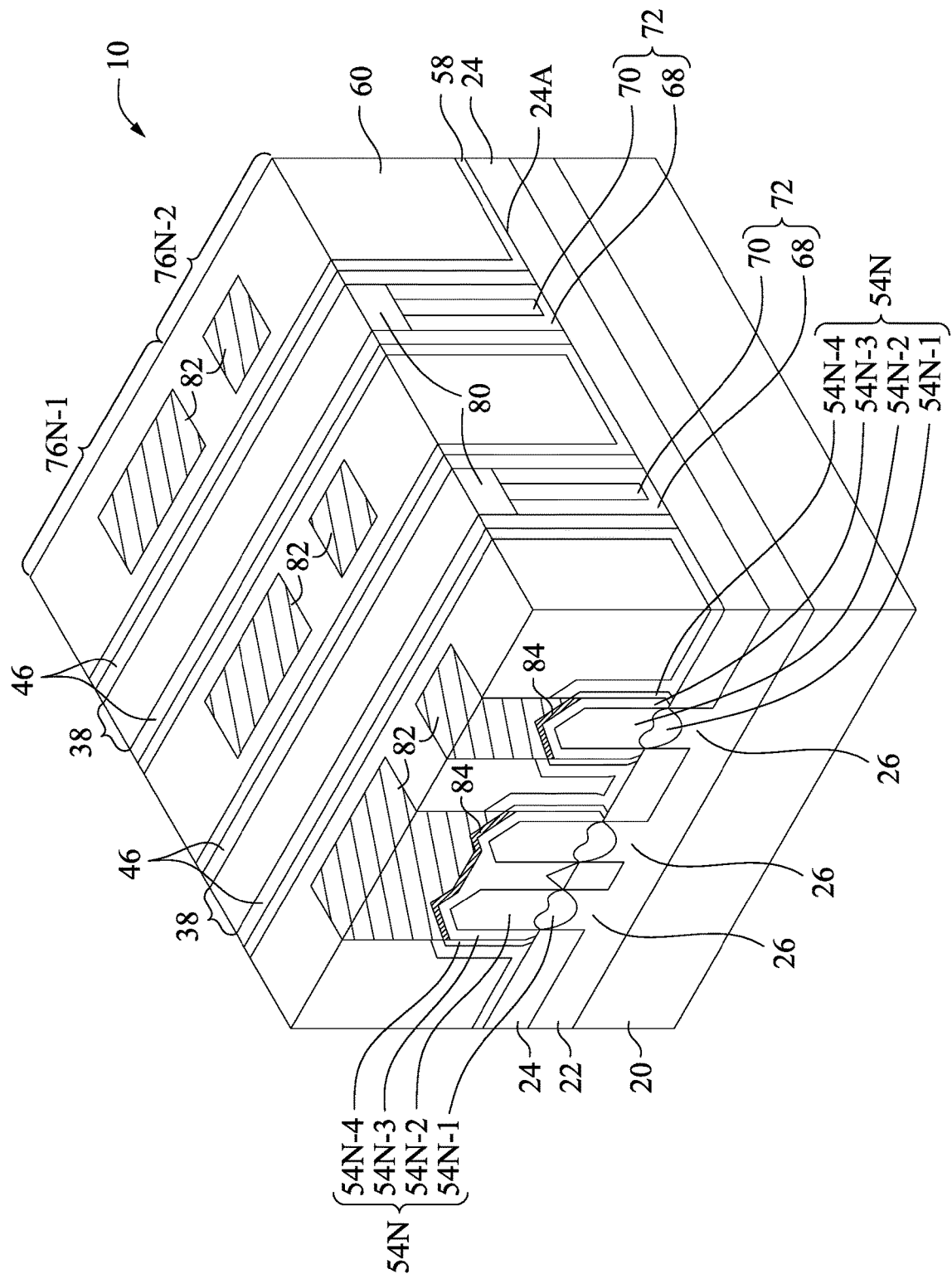

FIG. 20 illustrates the formation of source/drain contact plugs 82. The respective process is illustrated as process 224 in the process flow 200 shown in FIG. 22. The formation of source/drain contact plugs 82 includes etching ILD 60 to expose the underlying portions of CESL 58, and then etching the exposed portions of CESL 58 to reveal source/drain regions 54N. In a subsequent process, a metal layer (such as a titanium layer) is deposited and extends into the contact openings. A metal nitride capping layer may be formed. An anneal process is then performed to react the metal layer with the top portion of source/drain regions 54N to form silicide regions 84. A filling-metallic material such as tungsten, cobalt, or the like, is then filled into the contact openings, followed by a planarization process to remove excess materials, resulting in source/drain contact plugs 82. Gate contact plugs (not shown) are also formed to penetrate through a portion of each of hard masks 80 to contact gate electrodes 70. N-type FinFETs 76N-1 and 76N-2 are thus formed. FinFET 76N-1 includes the merged source/drain regions 54N, and FinFET 76N-2 includes the discrete source/drains 54N.

FIGS. 12 through 16 illustrate the formation of source/drains 54P for p-type FinFETs in accordance with some embodiment. Unless specified otherwise, the materials and the formation processes of the components in these embodiments are essentially the same as the like components, which are denoted by like reference numerals in the preceding embodiments shown in FIGS. 1-5 and 17-20. The details regarding the formation process and the materials of the components shown in FIGS. 12 through 16 may thus be found in the discussion of the preceding embodiments.

Figure 12:
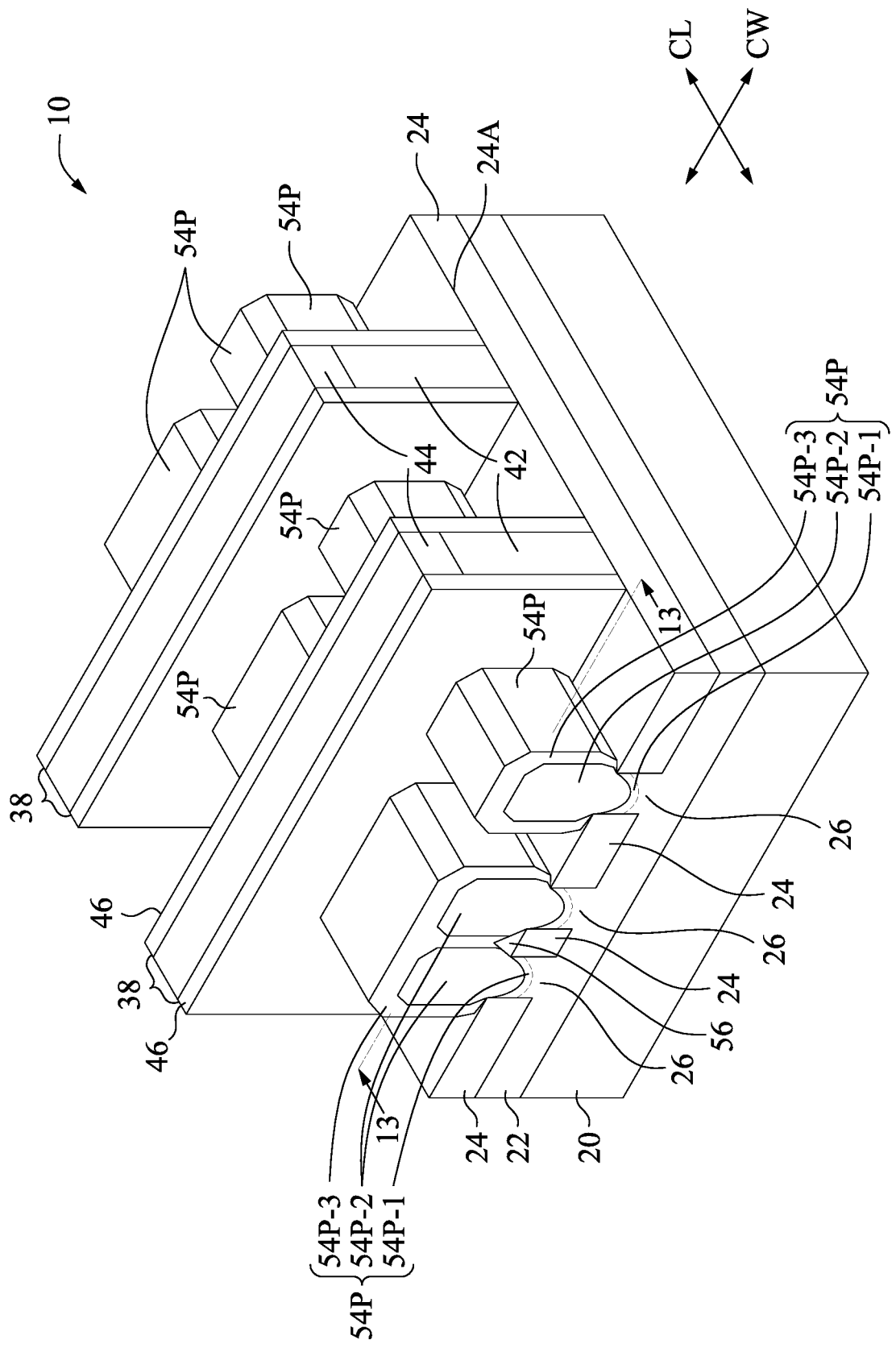
FIGS. 12-16 and 21 illustrate the perspective views and cross-sectional views of intermediate stages in the formation of p-type Fin Field-Effect Transistors (FinFETs) in accordance with some embodiments.
Figure 13:
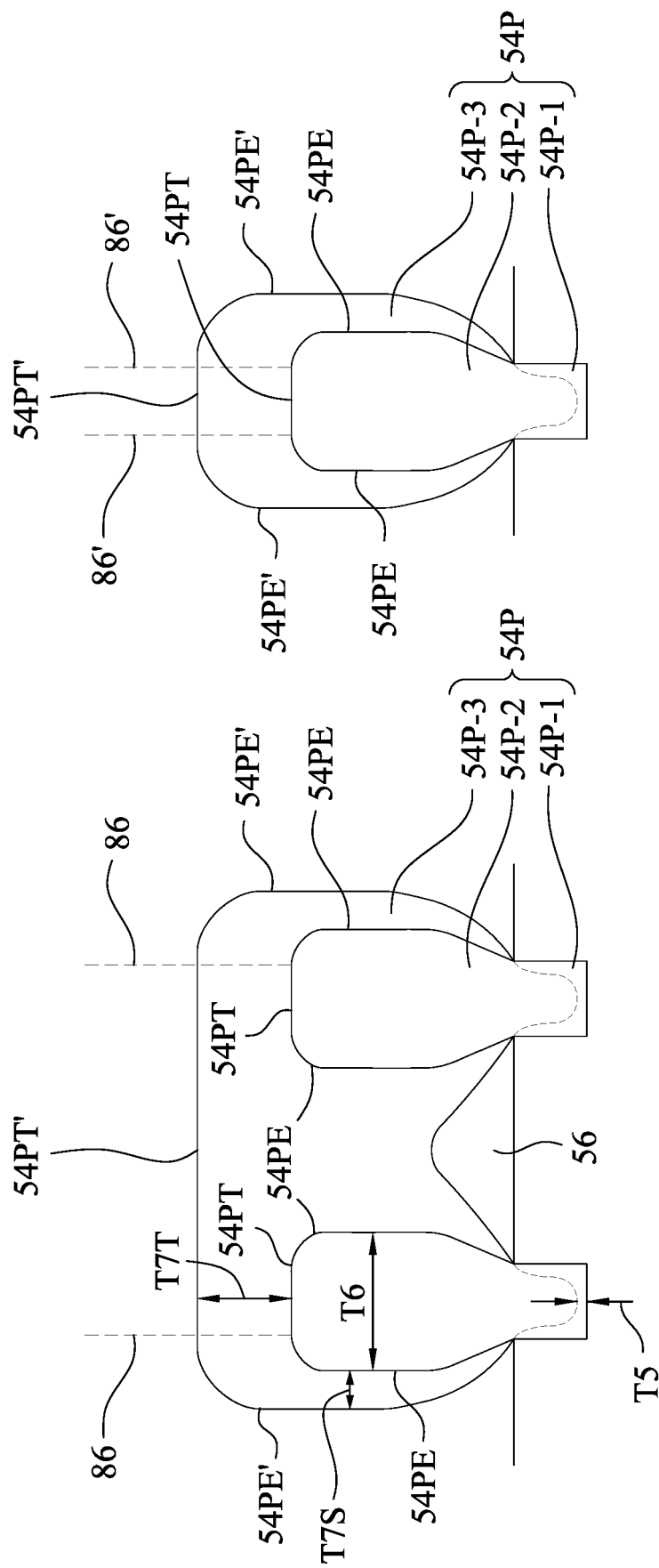

The initial steps of these embodiments are essentially the same as shown in FIGS. 1 through 5. The well region 22 in accordance with these embodiments is an n-type well region. Next, as shown in FIG. 12, p-type source/drain regions 54P are formed. The epitaxy materials grown from neighboring semiconductor strips are merged with each other to form the source/drain region 54P on the left side of FIG. 12, while the source/drain regions 54P shown on the right side of FIG. 12 is grown from a single semiconductor strip 26. Source/drain regions 54P include epitaxy layers 54P-2 and 54P-3 over epitaxy layers 54P-2. Epitaxy layers 54P-1 may or may not be formed. FIG. 13 illustrates a cross-sectional view, with dimensions marked in FIG. 13, which shows the reference cross-section 13-13 in FIG. 12.

In accordance with some embodiments, the first epitaxy layers 54P-1 (if formed) may comprise SiGe or Si. The precursors may include a silicon-containing gas such as silane, disilane, dichlorosilane, or the like. There may also be a germanium-containing gas such as germane, digermane, germanium tetrachloride, or the like in the precursors. The flow rate of the precursors may be in the range between about 10 Torr and about 50 Torr. The deposition method may include CVD, Molecular Bean Epitaxy (MBE), PVD, ALD, or the like. The precursors may be free from p-type dopant containing gases, or may include a p-type-containing precursor such as Boron trichloride ($BCl_3$). The wafer temperature during the deposition of epitaxy layers 54P-1 may be in the range between about 400° C. and about 700° C. in accordance with some embodiments. The resulting epitaxy layers 54P-1 may be free from germanium, or may have a low germanium concentration, for example, lower than about $5 \times 10^{20}/cm^3$. The thickness T5 (FIG. 13) of epitaxy layers 54P-1 may be smaller than about 20 nm, and may be in the range between about 2 nm and about 20 nm.

In accordance with some embodiments, the second epitaxy layers 54P-2 may comprise SiGe. The precursors may include a silicon-containing gas such as silane, disilane, dichlorosilane or the like, a germanium-containing gas such as germane, digermane, germanium tetrachloride, or the like, and a p-type-containing precursor such as Boron trichloride ($BCl_3$). The flow rate of the precursors may be in the range between about 10 Torr and about 50 Torr. In accordance with some embodiments, epitaxy layers 54P-2 have vertical-and-straight edges 54PE, which are on the (110) planes of the grown semiconductor material. In the epitaxy of epitaxy layers 54P-2, straight-and-vertical edges 54PE start to be formed once epitaxy layers 54P-2 are grown higher than the top surfaces of STI regions 24. In addition, once the straight-and-vertical edges 54PE are formed, continued growth results in epitaxy layers 54P-2 to be taller and wider. The vertical growth rate VGR-P2 is significantly greater than the horizontal growth rate HGR-P2, for example, with ratio VGR-P2/HGR-P2 being greater than 4, and may be in the range between about 4 and about 10. In accordance with some embodiments, the wafer temperature and the germanium concentration in combination are selected to achieve straight-and-vertical edges 54PE, and when one of the temperature and the germanium concentration is out of (higher than or lower than) the selected temperature range and the selected germanium concentration range, slanted facets will be formed, causing the resulting epitaxy layer to have greater lateral growth rate with the proceeding of the epitaxy. In accordance with some embodiments, to achieve the growth of the straight-and-vertical edges 54PE, the wafer temperature may be in the range between about 400° C. and about 700° C. in accordance with some embodiments, and the germanium atomic percentage in epitaxy layers 54P-2 may be in the range between about 10 percent and about 40 percent. The p-type dopant concentration in epitaxy layers 54P-2 may be in the range between about $1 \times 10^{20}/cm^3$ and about $5 \times 10^{20}/cm^3$. The thickness T6 of epitaxy layers 54P-2 is greater than the width of the underlying semiconductor strip 26. In accordance with some embodiments, the thickness T6 of epitaxy layers 54P-2 may be in the range between about 5 nm and about 20 nm. The deposition method may include CVD, Molecular Bean Epitaxy (MBE), Physical Vapor Deposition (PVD), ALD, or the like, and the method may be the same as or different from the method for forming epitaxy layers 54N-1.

The thickness T6 of epitaxy layers 54P-2 is greater than the width of the underlying semiconductor strip 26. In accordance with some embodiments, the thickness T6 of epitaxy layers 54P-2 is greater than about 5 nm, and may be in the range between about 5 nm and about 20 nm.

In accordance with some embodiments, the third epitaxy layers 54P-3 may comprise SiGe. The precursors for forming epitaxy layers 54P-3 may be selected from the same candidate precursors for forming epitaxy layers 54P-2, and may be the same as or different from the precursors used for forming epitaxy layers 54P-2. The flow rate of the precursors may be in the range between about 10 Torr and about 50 Torr. In accordance with some embodiments, the combination of the wafer temperature and the germanium concentration are selected to achieve a smaller VGR-P3/HGR-P3 ratio (the ratio of the vertical growth rate to the horizontal growth rate), so that the gaps between neighboring epitaxy layers 54P-2 may be filled. For example, VGR-P3/HGR-P3 ratio may be in the range between about 1 and about 3. Furthermore, epitaxy layers 54P-3 may have straight-and-vertical outer edges 54PE', which are on the (110) planes of the grown semiconductor material. In accordance with some embodiments, to form epitaxy layers 54P-3, the wafer temperature may be in the range between about 400° C. and about 700° C., and the wafer temperature may be the same as or different from that is used in the formation of epitaxy layers 54P-2. The germanium atomic percentage in epitaxy layers 54P-3 may be selected (for example, by increasing the flow rate of the germanium-containing precursor) to be higher than the germanium concentration in epitaxy layers 54P-2, so that the growth rate ratio VGR-P3/HGR-P3 is smaller than VGR-P2/HGR-P2. For example, the germanium atomic percentage in epitaxy layers 54P-3 may be in the range between about 30 percent and about 80 percent. The p-type dopant concentration in epitaxy layers 54P-3 may be higher than or equal to that in epitaxy layers 54P-2, and may be in the range between about $3 \times 10^{20}/cm^3$, and about $3 \times 10^{21}/cm^3$. The deposition method may include CVD, Molecular Bean Epitaxy (MBE), PVD, ALD, or the like. In accordance with some embodiments, the deposition method is the same as (or different from) the method for forming epitaxy layers 54P-2.

In accordance with some embodiments, germanium atomic percentages in epitaxy layers 54P-2 are selected to achieve the vertical edges. When the process is transitioned from the deposition of epitaxy layers 54P-2 to the deposition of epitaxy layers 54P-3, the process conditions such as the flow rate of the germanium-containing precursor is increased, while all other process conditions such as the wafer temperature, the flow rate of carrier gases, etc., are not changed.

Figure 21:
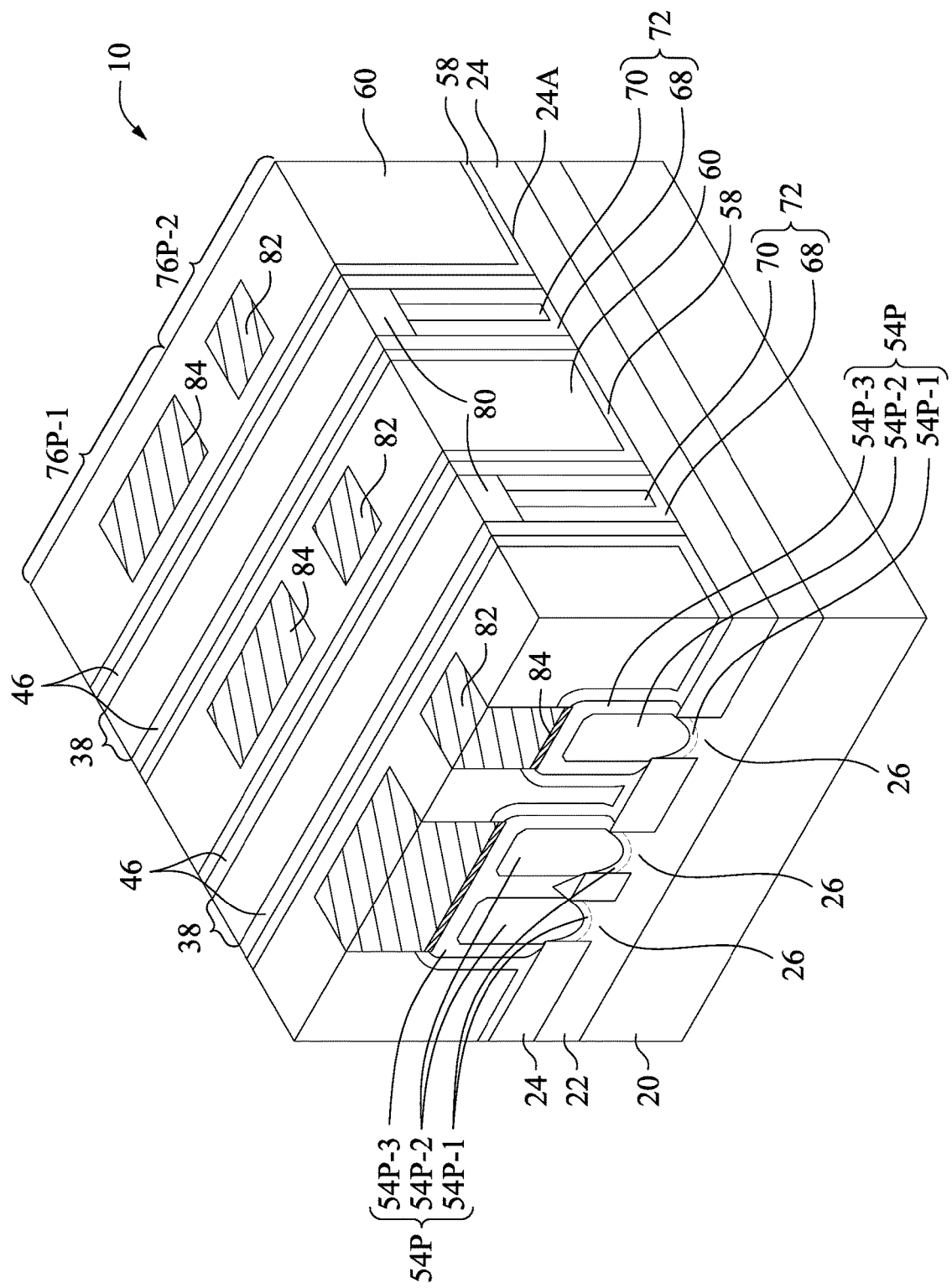

After the source/drain regions 54P as shown in FIG. 12 are formed, subsequent processes similar to the processes shown in FIGS. 17 through 20 are performed, and the resulting structure is shown in FIG. 21. The details of the processes and the materials may be found by referring to the discussion of the like features as shown in FIG. 20, which details are not repeated herein. The resulting FinFETs include p-type FinFET 76P-1 and 76P-2.

FIG. 13 illustrates the cross-sectional view of the two source/drain regions 54P as shown in FIG. 12. In accordance with some embodiments, epitaxy layers 54P-3 have substantially planar top surfaces, which are substantially planar in the range between dashed lines 86, and between dashed lines 86'. The planar top surfaces 54PT of the (merged) source/drain region 54P on the left may be fully inside the range marked by dashed lines 86. The single planar top surface 54PT of the source/drain region 54P on the right may be fully inside the range marked by dashed lines 86'. Furthermore, epitaxy layers 54P-3 have straight-and-vertical outer edges 54PE', which are connected to the corresponding planar top surfaces 54PT' through curved surfaces.

Figure 14:
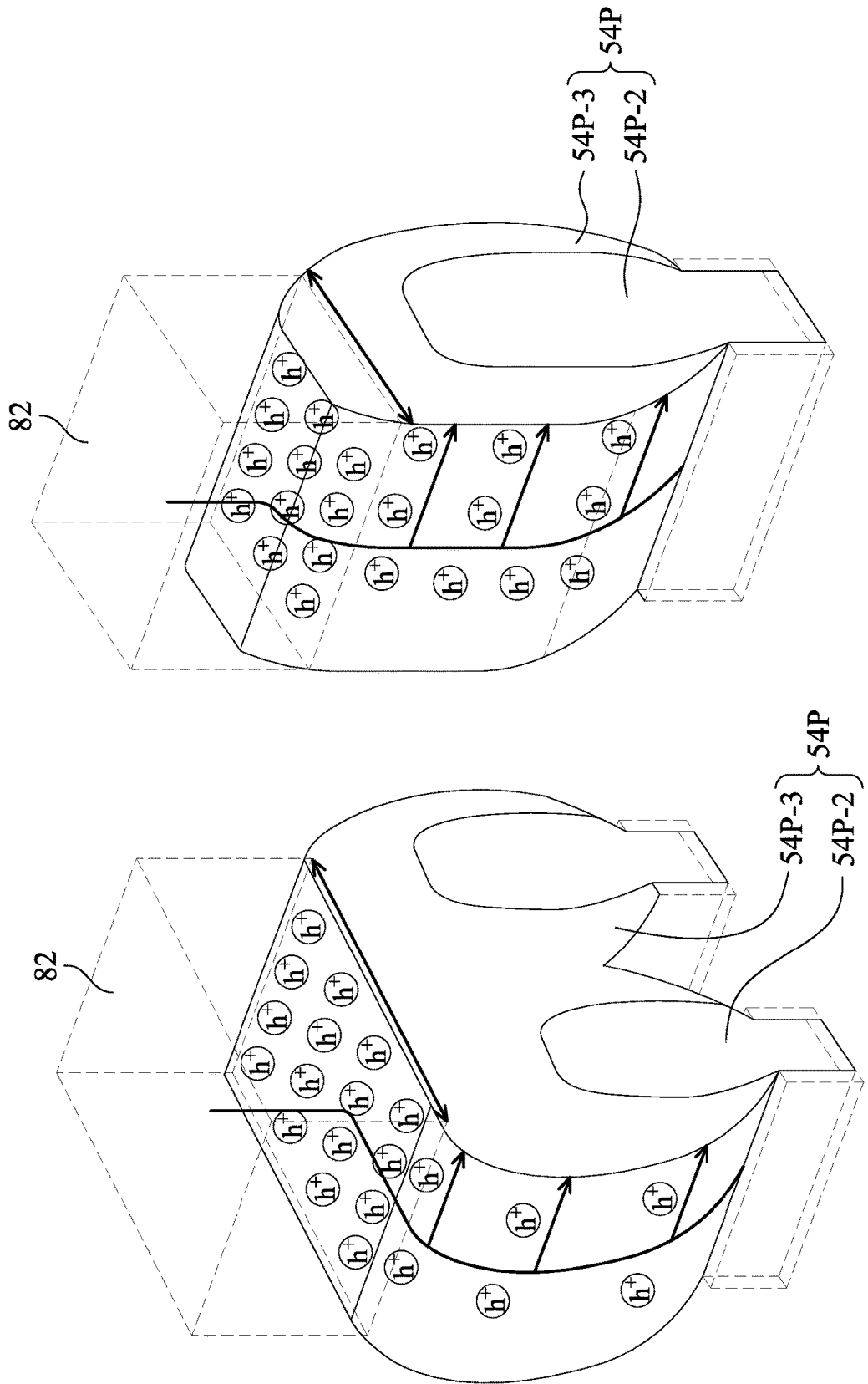

FIG. 14 illustrates contact plugs 82 overlying and electrically connecting to source/drain regions 54P, wherein symbols h+ represent the dominate carrier (holes) of the p-type FinFETs. It is shown that with the large planar top surfaces of source/drain regions 54P, the contact areas between the contact plugs 82 and the underlying source/drain regions 54P are large, so that the contact resistance is small. Furthermore, contact plugs 82 land on the epitaxy layers 54P-3 that have high p-type dopant concentration. Accordingly, the contact resistance is further reduced, and the performance of the resulting p-type FinFETs are improved.

Figure 15:
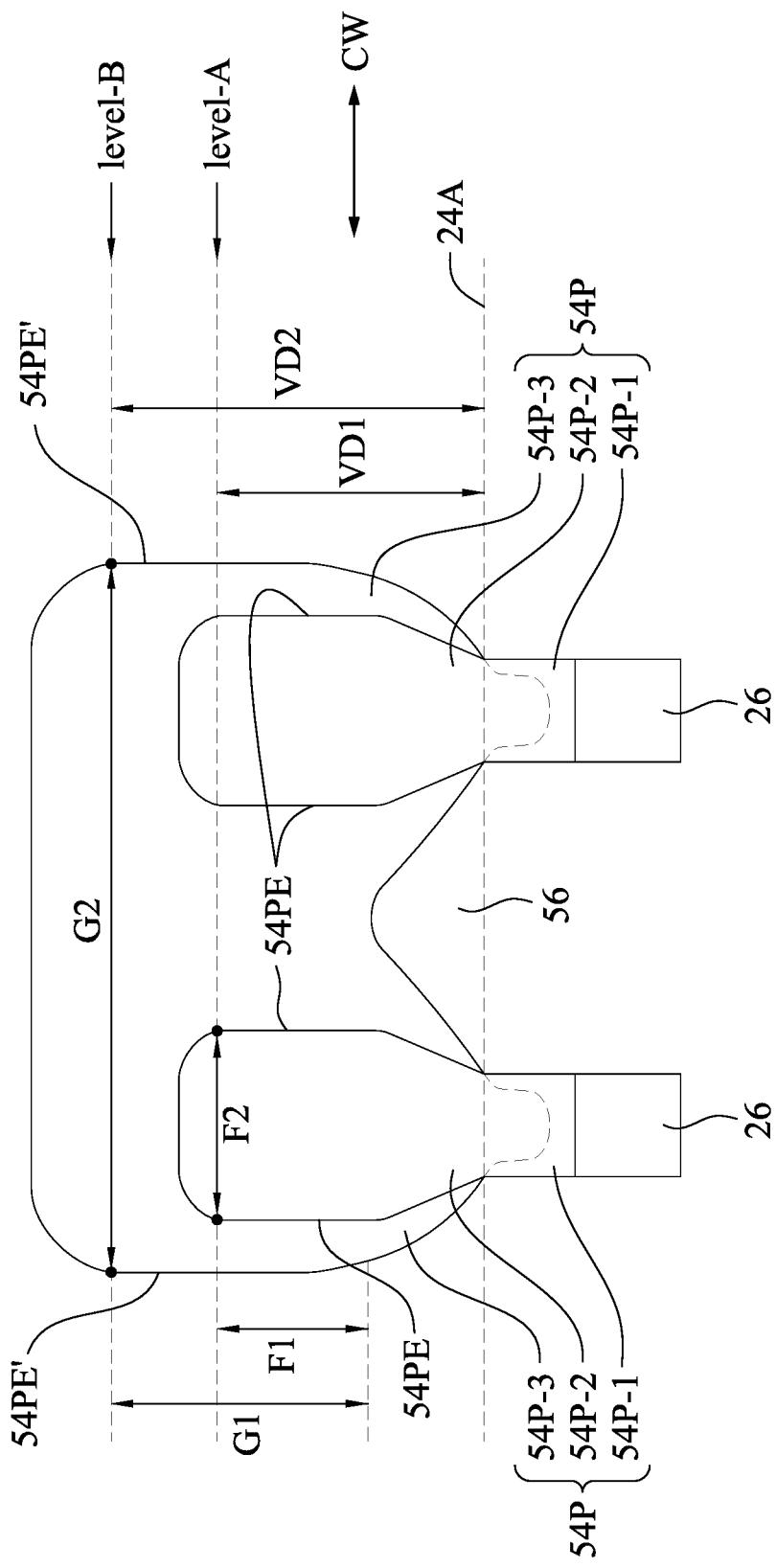
Figure 16:
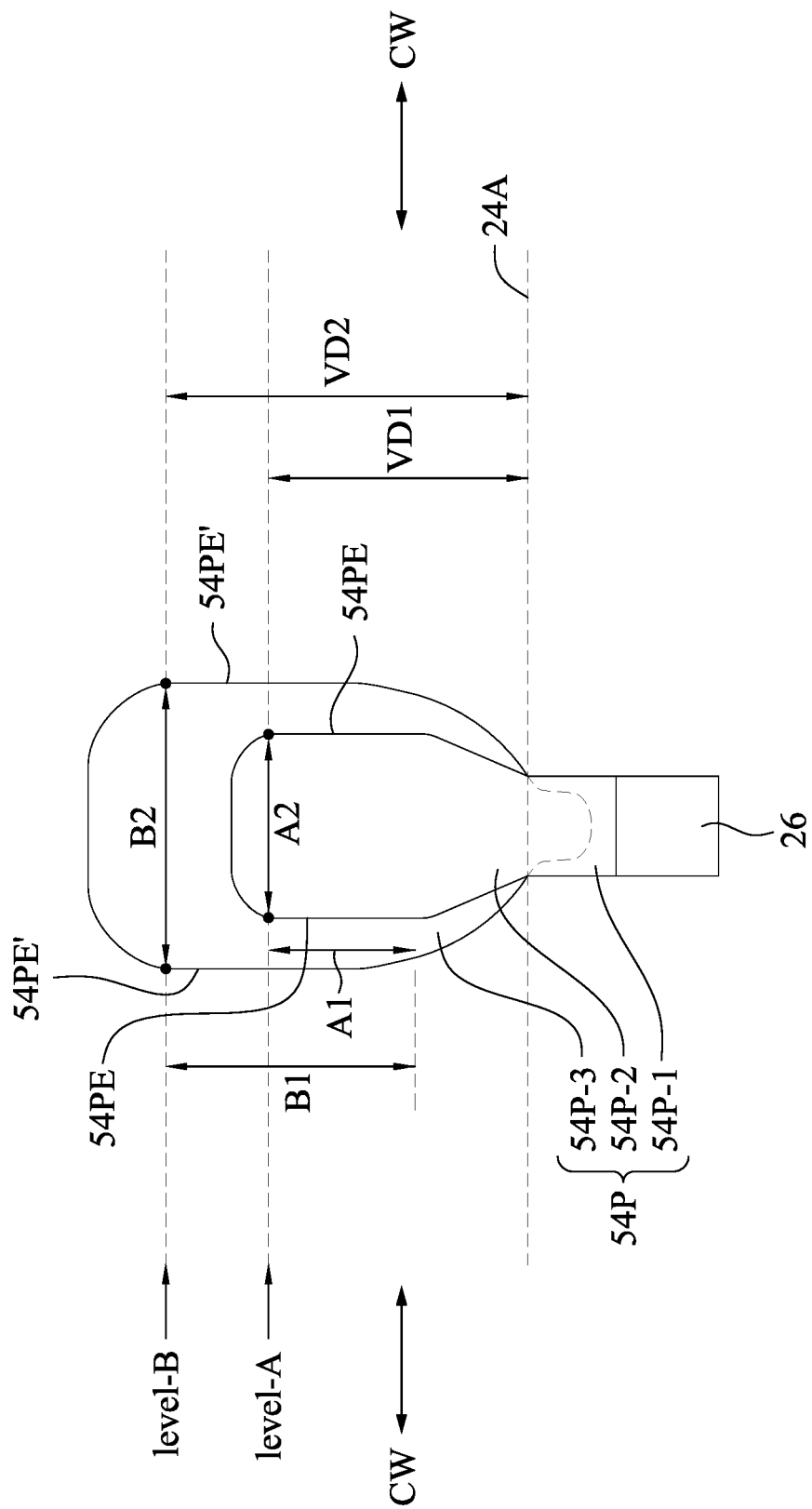

FIGS. 15 and 16 illustrate some dimensions and values of epitaxy layers 54P-2 and 54P-3. Two lines level-A and level-B are drawn, with level-A representing the top-end level of the straight-and-vertical edges 54PE of epitaxy layers 54P-2, and level-B representing the top-end level of the straight-and-vertical edges 54PE' of epitaxy layers 54P-3. The vertical distance VD1 from level-A to the channel bottom (the top surface 24A of STI regions 24) may be in the range between about 20 nm and about 80 nm. The vertical distance VD2 from level-B to the channel bottom (the top surface 24A of STI regions 24) may be in the range between about 30 nm and about 100 nm.

Referring to FIG. 15, in accordance with some embodiments, the height F1 of the straight edges 54PE of epitaxy layers 54P-2 may be in the range between about 10 nm and about 70 nm. The width F2 of epitaxy layers 54P-2 measured at the level marked as level-A may be in the range between about 5 nm and about 50 nm. Ratio F1/F2 may be equal to or greater than 1.0, and may be in the range between about 2 and 10. The heights G1 of the straight edges 54PE' of epitaxy layers 54P-3 may be in the range between about 20 nm and about 90 nm. The width G2 of epitaxy layers 54P-2 measured at the level marked as level-B may be in the range between about 30 nm and about 300 nm. Ratio G2/G1 may be equal to or greater than 1.0, and may be in the range between about 2 and 5.

Referring to FIG. 16, in accordance with some embodiments, the heights A1 of the straight edges 54PE of epitaxy layers 54P-2 may be in the range between about 10 nm and about 70 nm. The width A2 of epitaxy layer 54P-2 measured at the level marked as level-A is in the range between about 5 nm and about 50 nm. Ratio A1/A2 may be equal to or greater than 2, and may be in the range between about 2 and 10. The height B1 of the straight edges 54PE' of epitaxy layers 54P-3 may be in the range between about 20 nm and about 90 nm. The width B2 of epitaxy layers 54P-2 measured at the level marked as level-B may be in the range between about 30 nm and about 300 nm. Ratio B2/B1 may be equal to or greater than 1.0, and may be in the range between about 2 and 5.

The embodiments of the present disclosure adopt a unique combination to achieve small lateral growth and great landing areas for source/drain contact plugs. For the formation of the source/drain regions of n-type FinFETs, temperature is adjusted to achieve vertical growth and the subsequent conformal growth. For the formation of the source/drain regions of p-type FinFETs, the germanium atomic percentage is adjusted to achieve vertical growth and the subsequent growth.

The embodiments of the present disclosure have some advantageous features. By tuning proper process conditions and compositions of source/drain regions, the resulting source/drain regions include layers that have straight-and-vertical edges, which limits the lateral growth of source/drain regions when the source/drain regions are grown laterally. This reduces the likelihood of the bridging of neighboring source/drain regions. An additional layer is then deposited to merge source/drain regions and to increase the lateral sizes, so that the landing areas of source/drain contact plugs are increased to desirable values. Furthermore, since the lateral sizes of the source/drain regions are limited, the through-wafer uniformity is improved.

In accordance with some embodiments of the present disclosure, a method includes forming a gate stack on a first portion of a semiconductor fin; removing a second portion of the semiconductor fin to form a recess; and forming a source/drain region starting from the recess, wherein the forming the source/drain region comprises performing a first epitaxy process to grow a first semiconductor layer, wherein the first semiconductor layer comprises straight-and-vertical edges; and performing a second epitaxy process to grow a second semiconductor layer on the first semiconductor layer, wherein the first semiconductor layer and the second semiconductor layer are of a same conductivity type. In an embodiment, the straight-and-vertical edges are on (110) planes of the first semiconductor layer. In an embodiment, the first semiconductor layer is grown from an underlying semiconductor strip, with the underlying semiconductor strip being between opposing portions of shallow trench isolation regions, and wherein a portion of the first semiconductor layer having the straight-and-vertical edges is wider than the underlying semiconductor strip. In an embodiment, the source/drain region has a lower portion between opposing portions of shallow trench isolation regions, and the straight-and-vertical edges belong to a portion of the first semiconductor layer protruding higher than the shallow trench isolation regions. In an embodiment, the same conductivity type is n-type, and the first epitaxy process is performed at a first temperature, and the second epitaxy process is performed at a second temperature lower than the first epitaxy process. In an embodiment, the first semiconductor layer is grown vertically with substantially no lateral growth, and wherein the second semiconductor layer is grown conformally. In an embodiment, the same conductivity type is p-type, and the first semiconductor layer has a first germanium atomic percentage, and the second semiconductor layer has a second germanium atomic percentage higher than the first germanium atomic percentage. In an embodiment, the first epitaxy process and the second epitaxy process are performed at a same temperature. In an embodiment, the first germanium atomic percentage is in a range between about 10 percent and about 40 percent, and the second germanium atomic percentage is in a range between about 30 percent and about 80 percent.

In accordance with some embodiments of the present disclosure, a device includes a semiconductor substrate; isolation regions extending into the semiconductor substrate; a protruding semiconductor fin protruding higher than top surfaces of the isolation regions; a gate stack on a top surface and sidewalls of the protruding semiconductor fin; and a source/drain region on a side of the gate stack, the source/drain region comprising a first semiconductor layer comprising a first vertical edge and a second vertical edge parallel to each other; and a second semiconductor layer on the first semiconductor layer, wherein the second semiconductor layer extends both laterally and vertically from the first semiconductor layer. In an embodiment, the source/drain region is of n-type. In an embodiment, the first semiconductor layer comprises triangular top surfaces. In an embodiment, a ratio of a height of the first vertical edge to a distance between the first vertical edge and the second vertical edge is greater than about 5. In an embodiment, the second semiconductor layer is conformal. In an embodiment, the source/drain region is of p-type. In an embodiment, the first semiconductor layer further comprises a first planar top surface. In an embodiment, the second semiconductor layer further comprises a second planar top surface.

In accordance with some embodiments of the present disclosure, a device includes a plurality of isolation regions comprising a first portion and a second portion; a semiconductor strip between and contacting the first portion and the second portion; a source/drain region overlapping the semiconductor strip, the source/drain region comprising a first semiconductor layer comprising a first vertical edge and a second vertical edge on (110) planes of the first semiconductor layer; and a first slanted top surface and a second slanted top surface joining with each other to form a triangle, wherein the first slanted top surface and the second slanted top surface are connected to the first vertical edge and the second vertical edge, respectively; and a second semiconductor layer on the first semiconductor layer. In an embodiment, the source/drain region is of n-type, and the second semiconductor layer is conformal. In an embodiment, the second semiconductor layer has a higher n-type doping concentration than the first semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor substrate comprising a major bottom surface;
   isolation regions extending into the semiconductor substrate;
   a protruding semiconductor fin protruding higher than top surfaces of the isolation regions;
   a gate stack on a top surface and sidewalls of the protruding semiconductor fin; and
   a source/drain region on a side of the gate stack, the source/drain region comprising:
   a first semiconductor layer comprising a first vertical edge and a second vertical edge parallel to each other, wherein the first vertical edge and the second vertical edge are straight and are perpendicular to the major bottom surface of the semiconductor substrate; and
   a second semiconductor layer on the first semiconductor layer, wherein the second semiconductor layer extends both laterally and vertically from the first semiconductor layer.

2. The device of claim 1, wherein the source/drain region is of n-type.

3. The device of claim 1, wherein the first semiconductor layer comprises triangular top surfaces in a cross-sectional view.

4. The device of claim 1, wherein a ratio of a height of the first vertical edge to a distance between the first vertical edge and the second vertical edge is greater than about 5.

5. The device of claim 1, wherein the second semiconductor layer is conformal.

6. The device of claim 1, wherein the second semiconductor layer comprises a portion between, and comprising opposing sidewalls physically contacting, the first vertical edge and the second vertical edge, and wherein the first vertical edge and the second vertical edge have heights greater than at least a distance between the first vertical edge and the second vertical edge.

7. The device of claim 1, wherein the first semiconductor layer further comprises a first planar top surface.

8. The device of claim 1, wherein the second semiconductor layer further comprises a second planar top surface.

9. A device comprising:
   a semiconductor substrate;
   dielectric isolation regions extending into the semiconductor substrate;
   a protruding semiconductor fin protruding higher than top surfaces of the dielectric isolation regions;
   a gate stack extending on the protruding semiconductor fin;
   a source/drain region on a side of the gate stack, the source/drain region comprising:
   a first semiconductor layer comprising a lower portion extending between the dielectric isolation regions, and an upper portion higher than the dielectric isolation regions; and
   a second semiconductor layer on the first semiconductor layer, wherein the second semiconductor layer contacts opposite sidewalls of the upper portion of the first semiconductor layer to form a first vertical interface and a second vertical interface; and
   an air gap, wherein bottoms of the second semiconductor layer are exposed to the air gap, and wherein the first semiconductor layer is separated from the air gap by the second semiconductor layer.

10. The device of claim 9, wherein the first semiconductor layer comprises:
    a first slanted top surface joined to the first vertical interface; and
    a second slanted top surface joined to both of the second vertical interface and the first slanted top surface.

11. The device of claim 9 further comprising a source/drain silicide region over and contacting the source/drain region.

12. A device comprising:
    a semiconductor substrate;
    isolation regions extending into the semiconductor substrate;
    a protruding semiconductor fin protruding higher than top surfaces of the isolation regions;
    a gate stack on a top surface and sidewalls of the protruding semiconductor fin; and
    a source/drain region on a side of the gate stack, the source/drain region comprising:
    a first semiconductor layer comprising a first vertical edge and a second vertical edge parallel to each other, wherein a ratio of a height of the first vertical edge to a distance between the first vertical edge and the second vertical edge is greater than about 5; and
    a second semiconductor layer on the first semiconductor layer, wherein the second semiconductor layer extends both laterally and vertically from the first semiconductor layer.

13. The device of claim 12, wherein the source/drain region is of n-type.

14. The device of claim 12, wherein the first semiconductor layer comprises triangular top surfaces in a cross-sectional view.

15. The device of claim 12, wherein the second semiconductor layer is conformal.

16. The device of claim 12, wherein the source/drain region is of p-type.

17. The device of claim 12, wherein the first semiconductor layer further comprises a first planar top surface.

18. The device of claim 12, wherein the second semiconductor layer further comprises a second planar top surface.

19. The device of claim 1 further comprising an air gap, wherein bottoms of the second semiconductor layer are exposed to the air gap, and wherein the first semiconductor layer is separated from the air gap by the second semiconductor layer.

20. The device of claim 9, wherein the first vertical interface and the second vertical interface are perpendicular to a major bottom surface of the semiconductor substrate.

* * * * *